(12) United States Patent
Chen et al.

(10) Patent No.: US 8,339,134 B2
(45) Date of Patent: Dec. 25, 2012

(54) APPARATUS AND METHOD FOR REDUCING A TRANSIENT SIGNAL IN A MAGNETIC FIELD SENSOR

(75) Inventors: Weihua Chen, Westford, MA (US); Michael G. Ward, Wells, ME (US)

(73) Assignee: Allegro Microsystems, Inc., Worcester, MA (US)

( * ) Notice: Subject to any disclaimer, the term of this patent is extended or adjusted under 35 U.S.C. 154(b) by 154 days.

(21) Appl. No.: 12/900,969

(22) Filed: Oct. 8, 2010

(65) Prior Publication Data

US 2012/0086444 A1 Apr. 12, 2012

(51) Int. Cl.
*G01R 33/00* (2006.01)
*G01B 7/30* (2006.01)

(52) U.S. Cl. .................. 324/261; 324/207.25

(58) Field of Classification Search ............ 324/207.25, 324/261
See application file for complete search history.

(56) References Cited

U.S. PATENT DOCUMENTS

| | | | |
|---|---|---|---|
| 4,268,785 A | 5/1981 | Svendsen | |
| 4,339,715 A * | 7/1982 | Bloodworth et al. | 324/252 |
| 5,912,556 A | 6/1999 | Frazee et al. | |
| 6,035,712 A | 3/2000 | Ohta et al. | |
| 6,252,395 B1 * | 6/2001 | Aoyama et al. | 324/207.12 |
| 6,781,359 B2 | 8/2004 | Stauth et al. | |
| 7,116,099 B2 * | 10/2006 | Saito | 324/207.25 |
| 7,265,531 B2 | 9/2007 | Stauth et al. | |
| 2001/0003421 A1 * | 6/2001 | Kubota et al. | 324/207.2 |
| 2009/0212771 A1 | 8/2009 | Cummings et al. | |

FOREIGN PATENT DOCUMENTS

WO WO 2004/027436 4/2004

OTHER PUBLICATIONS

PCT Search Report and Written Opinion dated Nov. 14, 2011; for PCT Pat. App. No. PCT/US2011/051492; 11 pages.
Office Action dated Oct. 18, 2012 for U.S. Appl. No. 13/617,724; 8 pages.

* cited by examiner

*Primary Examiner* — Bot Ledynh
(74) *Attorney, Agent, or Firm* — Daly, Crowley, Mofford & Durkee, LLP

(57) ABSTRACT

A magnetic field sensor includes a compensation loop coupled in series with normal circuit couplings in order to reduce a transient signal that would otherwise be generated when the magnetic field sensor experiences a high rate of change of magnetic field. In some embodiments, the magnetic field sensor is a current sensor responsive to a magnetic field generated by a current-carrying conductor.

36 Claims, 19 Drawing Sheets

Section A-A

Section A-A

APPARATUS AND METHOD FOR REDUCING A TRANSIENT SIGNAL IN A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor that includes features that can reduce a transient signal that would otherwise be generated when the magnetic field sensor is in the presence of a rapidly changing magnetic field.

BACKGROUND OF THE INVENTION

As is known magnetic field sensors can be used in a variety of applications. In one application, a magnetic field sensor can be used to sense an electrical current. One type of current sensor uses a Hall effect magnetic field sensing element in proximity to a current-carrying conductor. The Hall effect magnetic field sensing element generates an output signal having a magnitude proportional to the magnetic field induced by the current through the conductor. Typical current sensors of this type include a gapped toroid magnetic flux concentrator, with the Hall effect device positioned in a toroid gap. The Hall effect device and toroid are assembled in a housing, which is mountable on a printed circuit board. In use, a separate current-carrying conductor, such as a wire, is passed through the center of the toroid and is soldered to the printed circuit board, such as by soldering exposed ends of the wire to plated through-holes.

Other configurations of current sensors that use magnetic field sensing elements are known. Other configurations of current sensors are described in U.S. Pat. No. 6,781,359, issued Aug. 24, 2004 and U.S. Pat. No. 7,265,531, issued Sep. 4, 2007, both of which are assigned to the assignee of the present invention and both of which are incorporated by reference herein in their entireties.

Various parameters characterize the performance of current sensors, including sensitivity, which is the change in the output signal of a current sensor in response to a one ampere change through the conductor, and linearity, which is the degree to which the output signal of a current sensor varies in direct proportion to the current through the conductor. Important considerations in magnetic field sensors include the effect of stray magnetic fields and external magnetic noise on the sensor performance.

It has been observed that an output signal from a magnetic field sensor, for example, a current sensor, tends to have a transient "glitch" when the magnetic field sensor is exposed to a very high rate of change of magnetic field, for example, as may be generated by a very high rate of change of current in a current-carrying conductor. The source of this glitch has not been understood.

Techniques, such as filters, have been employed to remove this unwanted glitch. However, filters tend to slow down a desired edge rate otherwise available at the output of a magnetic field sensor.

It would be desirable to provide a magnetic field sensor, for example, a current sensor, which does not have the undesired glitch in the output signal when exposed to a rapidly changing magnetic field (or current).

SUMMARY OF THE INVENTION

The present invention provides a magnetic field sensor, for example, a current sensor, which does not have the undesired glitch in the output signal when exposed to a rapidly changing magnetic field (or current).

In accordance with one aspect of the present invention, a magnetic field sensor includes a lead frame having a base plate, a ground pin coupled to the base plate, and a signal output pin. The magnetic field sensor also includes a circuit die disposed upon the base plate. The circuit die includes a substrate. The circuit die also includes a magnetic field sensing element disposed upon the substrate and configured to generate a magnetic field signal responsive to a magnetic field. The circuit die also includes an output circuit disposed upon the substrate. The output circuit includes a circuit ground node and a circuit output node. The output circuit is configured to generate an output signal at the circuit output node responsive to the magnetic field signal. The circuit die also includes a ground circuit trace having first and second ends. The first end of the ground circuit trace is coupled to the circuit ground node. The circuit die also includes a ground bonding pad coupled to the second end of the ground circuit trace. The circuit die also includes an output signal circuit trace having first and second ends. The first end of the output signal circuit trace is coupled to the circuit output node. The circuit die also includes an output signal bonding pad coupled to the second end of the output signal circuit trace. The magnetic field sensor further includes a circuit loop. The circuit loop includes a conductive path between the ground pin and the signal output pin. The circuit loop has a circuit loop interior area. The magnetic field sensor further includes a compensated signal output node coupled to the circuit output node. The magnetic field sensor further includes a conductive structure, which includes a compensation loop coupled in a series arrangement with the circuit loop. The compensation loop has a compensation loop interior area. The compensation loop interior area is selected to be related to the interior area of the circuit loop. A path traversing the circuit loop in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node resulting from the circuit loop experiencing a rapid change in flux of the magnetic field.

In some embodiments, the compensation loop is coupled between the circuit output node and the compensated signal output node or the compensation loop is coupled between the between a loop termination node and the ground node.

In accordance with another aspect of the present invention, in a magnetic field sensor having a lead frame having a ground pin and a signal output pin, the magnetic field sensor also comprising a circuit die disposed upon the lead frame and comprising a magnetic field sensing element and an output circuit coupled to the magnetic field sensing element, wherein the output circuit comprises a circuit ground node and a circuit output node, a method of compensating an output signal in the magnetic field sensor responsive to a magnetic field includes identifying a circuit loop in the magnetic field sensor. The circuit loop includes a conductive path between the ground pin and the signal output pin. The circuit loop has a circuit loop interior area. The method also includes providing a compensated signal output node coupled to the circuit output node. The method also includes providing a conductive structure. The providing the conductive structure includes providing a compensation loop coupled in a series arrangement with the circuit loop. The compensation loop has a compensation loop interior area selected to be related to the interior area of the circuit loop. A path traversing the circuit loop in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node resulting from the circuit loop experiencing a rapid change in flux of the magnetic field.

In some embodiments, providing the compensation loop comprises providing the compensation loop coupled between the circuit output node and the compensated signal output node or providing the compensation loop coupled between the between a loop termination node and the ground node.

BRIEF DESCRIPTION OF THE DRAWINGS

The foregoing features of the invention, as well as the invention itself may be more fully understood from the following detailed description of the drawings, in which:

FIG. 13 is a side view of a circuit die coupled to a lead frame with a direct bonding method, coupled with solder balls or the like; and FIG. 13A is a side view of a circuit die coupled to a lead frame with a direct bonding method in a relative flip-chip arrangement, coupled with solder balls or the like.

DETAILED DESCRIPTION OF THE INVENTION

Before describing the present invention, some introductory concepts and terminology are explained. As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most types of magnetoresistance elements tend to have axes of maximum sensitivity parallel to the substrate and most types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While magnetic field sensors having Hall effect elements are shown and described in examples below, the same techniques can be applied to a magnetic field sensor having any type of magnetic field sensing element.

Current sensors are shown and described in examples, below. However, the same techniques can be applied to any magnetic field sensor, and, desirably, to any magnetic field sensor that experiences a rapid rate of change in a magnetic field.

Current sensors with flux concentrators are shown and described in examples below. It will be understood that the use of a flux concentrator tends to increase the rate of change of a magnetic field experienced by the magnetic field sensor. While this increase tends to result in large output signal transients described below, for example, in conjunction with FIGS. 6 and 6A, techniques described below can be applied to any magnetic field sensor, with or without a flux concentrator.

Figure 1:
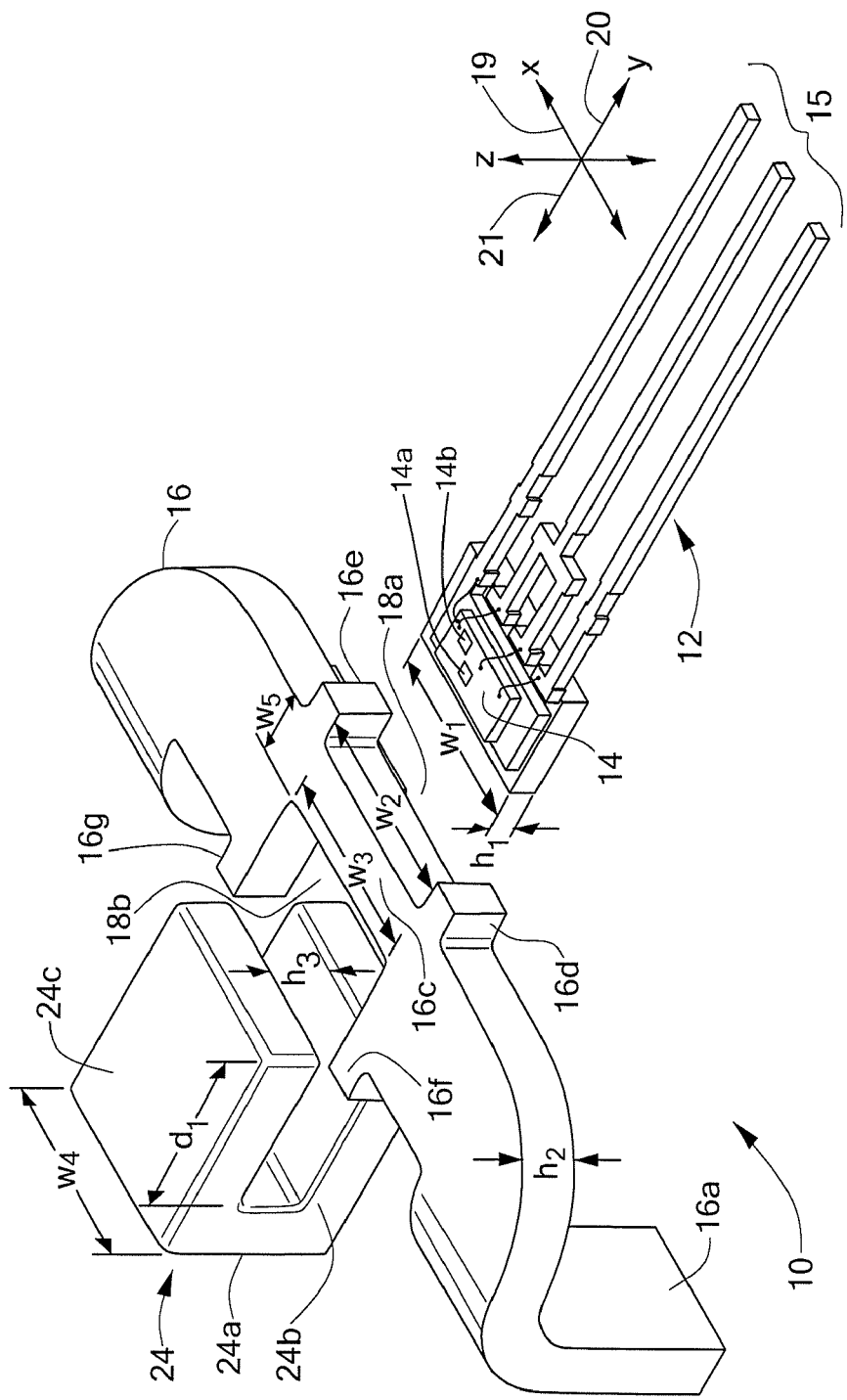
FIG. 1 is a pictorial showing a current sensor having a U-shaped flux concentrator.

Referring to FIG. 1, an integrated current sensor 10, shown in an exploded view prior to final assembly, includes a magnetic field sensing element, here in the form of Hall effect magnetic sensor 12 (here shown without an encapsulated body for clarity), a current-carrying conductor 16 and a magnetic core 24. The conductor 16 includes features for receiving portions of the Hall effect sensor 12 and the magnetic core 24 such that the elements are maintained in a fixed and aligned position relative to each other.

In the illustrated embodiment, the conductor 16 has a first notch 18a and a second notch 18b substantially aligned with the first notch. When assembled, at least a portion of the Hall effect sensor 12 is disposed in the first notch 18a. The magnetic core 24 is substantially C-shaped (or U-shaped) and has a central region 24a and a pair of substantially parallel legs 24b, 24c extending from the central region. When assembled, at least a portion of the central region 24a is disposed in the second notch 18b of the conductor 16 such that each leg 24b, 24c covers at least a portion of a respective surface of the Hall effect sensor 12.

In some embodiments, the conductor 16, and, in particular, the notches 18a, 18b, are formed by stamping.

The Hall effect sensor 12 is provided in the form of an integrated circuit containing a sensor die 14 having a Hall effect element 14a thereon, all encapsulated with an electrically insulating material. The integrated Hall effect sensor 12 can be provided in different package types, such as the "K" single in line (SIP) package having a thickness on the order of 1.6 mm. The effective air gap is equal to the thickness of the package, with the sensor die resting approximately in the center of the air gap.

The Hall effect sensor has leads 15 adapted for mounting to a printed circuit board (not shown). Leads 15 include a power, or Vcc, connection, a ground connection, and an output connection adapted to carry an output signal proportional to the current through the conductor 16. The output signal can be a current or a voltage.

The sensor die 14 includes the Hall effect element 14a and Hall circuitry 14b for processing the output signal of the Hall effect element 14a. Use of the Hall effect sensor 12 enhances the integration of the current sensor 10 by incorporating circuit components which otherwise would be provided separately, such as by discrete components mounted to a printed circuit board.

The conductor 16 can be comprised of various conductive materials, such as copper, and is adapted for mounting to a printed circuit board through which the measured current is provided to the conductor 16. To this end, bent leads or tabs 16a, 16b (16b not shown) suitable for soldering into circuit board vias (or holes) are provided at end portions of the conductor 16. Mechanisms other than bent tabs 16a, 16b may be used to mount the current sensor 10 to a circuit board, such as screw terminals and associated hardware or flat leads or tabs. In alternate embodiments, the same or other mounting mechanisms can be used to allow the current sensor 10 to be mounted to other than a circuit board. For example, the current sensor 10 can have wire couplings (not shown) that allow the current sensor 10 to be coupled in series with a wire.

Preferably, the conductor 16 (excluding the bent tabs 16a, 16b) is substantially planar as shown, without features extending in the z-axis 21 which would increase the height of the current sensor 10 off of the printed circuit board. In use, the plane of the conductor 16 is positioned close to the printed circuit board plane, thereby providing a low profile current sensor.

The first notch 18a of the conductor 16 has a width w2 selected to receive at least a portion of the Hall effect sensor 12, which has a width w1. Preferably, the width w1 and the width w2 are sufficiently similar so that, in assembly, the possible movement of the Hall effect sensor 12 relative to the conductor 16 in the x-axis 19 is negligible. More specifically, nominal width w1 is slightly smaller than nominal width w2, such as by approximately 0.28 mm, so that, with worst case tolerances, the largest width w1 is 0.4 mm smaller than the smallest width w2. In the illustrated embodiment, nominal width w1 is 5.18 mm and nominal width w2 is 5.46 mm. Widths w1 and w2 can thus be characterized as being substantially equal.

The second notch 18b of the conductor has a width w3 selected to receive at least a portion of the magnetic core 24. Preferably, the width w3 and the width w4 of the central region 24a of the magnetic core are sufficiently similar, so that, in assembly, the possible movement of the magnetic core 24 relative to the conductor 16 in the x-axis 19 is negligible. More specifically, nominal width w4 is slightly smaller than nominal width w3, such as by approximately 0.2 mm, so that, with worst case tolerances, the smallest width w4 is 0.34 mm smaller than the largest width w3 and the largest width w4 is 0.08 mm smaller than the smallest width w3. In the illustrated embodiment, nominal width w3 is 5.46 mm and nominal width w4 is 5.25 mm. Widths w3 and w4 can thus be characterized as being substantially equal.

The spacing h3 between magnetic core legs 24b, 24c, the thickness or height h2 of the conductor 16 and the thickness or height h1 of the Hall effect sensor 12 are all substantially similar so that possible movement of the components relative to each other in the z-axis 21 is restricted. More specifically, nominal conductor height h2 and sensor height h1 are slightly smaller than nominal height h3, such as by approximately 0.1 mm, so that, with worst case tolerances, the smallest height h1 and height h2 are 0.22 mm smaller than the largest height h3 and the largest height h1 and height h2 are 0.01 mm smaller than the smallest height h3. In the illustrated embodiment, the nominal height h1 is 1.55 mm, the nominal height h2 is 1.50 mm, and the nominal height h3 is 1.64 mm.

In other embodiments, however, the spacing h3 is selected in accordance with other factors. For example, in one alternate embodiment, the spacing h3 is substantially larger than the height h1 of the Hall effect sensor 12, in order to increase the reluctance and, therefore, to increase the current through the carrying conductor 16 that would saturate the current sensor 10. Thus, this alternate embodiment has a greater current carrying capacity.

The magnetic core 24 tailors the magnetic field across the sensor die 14 and may be referred to alternatively as a magnetic field concentrator, a magnetic flux concentrator, or simply as a flux concentrator. The magnetic core 24 may be comprised of various materials including, but not limited to ferrite, steel, iron compounds, and permalloy. The material of the magnetic core 24 is selected based on factors such as maximum measured current, which is related to a magnetic permeability of the core 24, and the desired amount of magnetic shielding provided by the magnetic core 24. Other factors include stability of the relative permeability over temperature and hysteresis (magnetic remanence). For example, a low hysteresis ensures greater accuracy for small currents through the conductor 16. The material and size of the magnetic core 24 are also selected in accordance with the desired full scale current through the conductor 16, wherein a magnetic core material with a higher saturation flux density (Bsat) allows the use of a smaller core for a given current flowing through the conductor 16. As will become apparent from consideration of FIG. 4 below, use of the magnetic core 24 significantly reduces the susceptibility of the current sensor 10 to stray magnetic fields.

The magnetic core 24 has a depth d1, selected so that each of the legs 24b, 24c substantially covers an entire respective surface of the sensor die 14. With this arrangement, a substantially uniform magnetic field is provided across the Hall effect element 14a disposed on the sensor die 14, thereby increasing device sensitivity and reducing susceptibility to stray magnetic fields.

Here, the conductor notch 18a is formed by tabs 16d, 16e extending radially outward from the conductor. Notch 18b is formed by a narrowed region 16c of the conductor in combination with tabs 16f, 16g extending from the conductor. The width w5 of the narrowed region 16c between the first and the second notches 18a, 18b is selected based on the maximum current carrying capability of the electrical conductor 16. In some embodiments, the width w5 is on the order 1.7 mm and the current carrying capability of the conductor 16 is on the order of 100 Amperes. Although the notches 18a, 18b could be formed by radial tabs 16d, 16e, and 16f, 16g respectively, without providing the narrowed conductor region 16c, the use of the narrowed region 16c minimizes the overall dimension of the current sensor 10 along the y-axis 20. The narrowed region also provides the current through the conductor 16 in closer proximity to the Hall effect sensor 12. In an alternate embodiment, the notches 18a, 18b are formed without the tabs 16d-16g, and are provided only by the narrowed region 16c.

It will be understood that the current carrying conductor 16, when passing a current, will cause a relatively large magnetic field at the Hall effect element 14a, larger than if the flux concentrator 24 were not used. Furthermore, it will become apparent from discussion below in conjunction with FIGS. 3 and 3A that the magnetic field at the Hall effect element 14a will be relatively uniform over a large area in x and y directions 19, 20, respectively, more uniform than if the flux concentrator 24 were not used.

Figure 2:
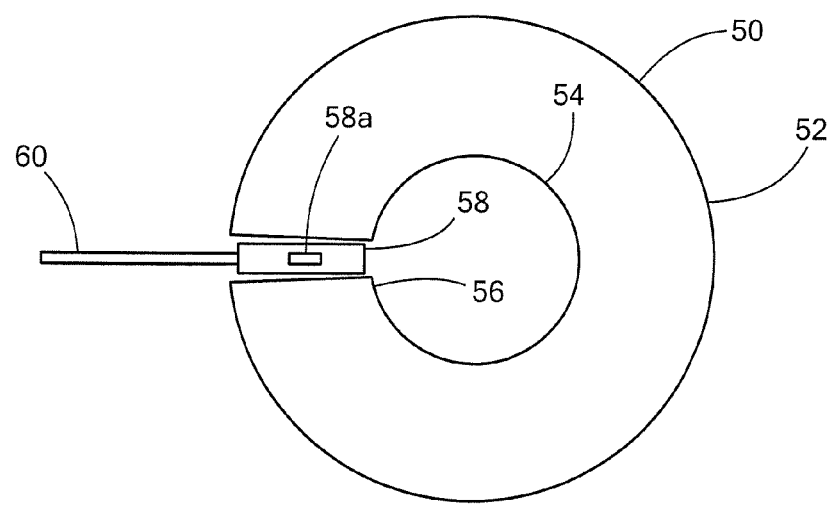
FIGS. 2 and 2A are block diagrams showing two views of another embodiment of a current sensor having a donut shaped flux concentrator.
Figure 2A:
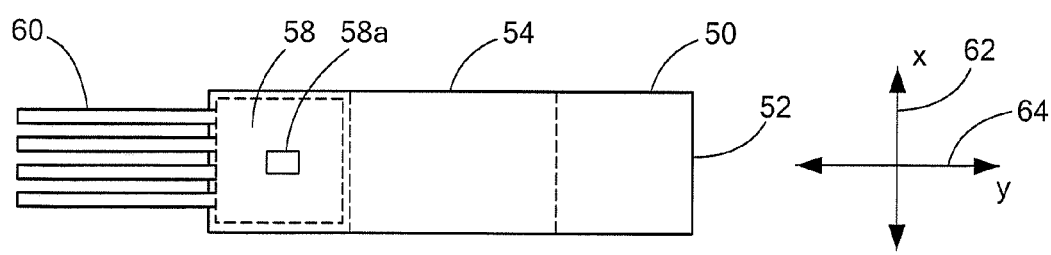

Referring now to FIGS. 2 and 2A, another embodiment 50 of a current sensor 50 includes a donut shaped flux concentrator 52 having a notch or cutout 56 therein and a central hole 54. A magnetic field sensor 58 having a Hall effect element 58a and leads 60 can be disposed in the notch 56.

It will be understood that a current carrying conductor (not shown) positioned to pass through the hole 54, when passing a current, will cause a relatively large magnetic field at the Hall effect element 58a, larger than if the flux concentrator 52 were not used. Furthermore, it will become apparent from discussion below in conjunction with FIGS. 3 and 3A that the magnetic field at the Hall effect element 58a will be relatively uniform over a large area in x and y directions 62, 64, respectively, more uniform than if the flux concentrator 52 were not used.

Figure 3:
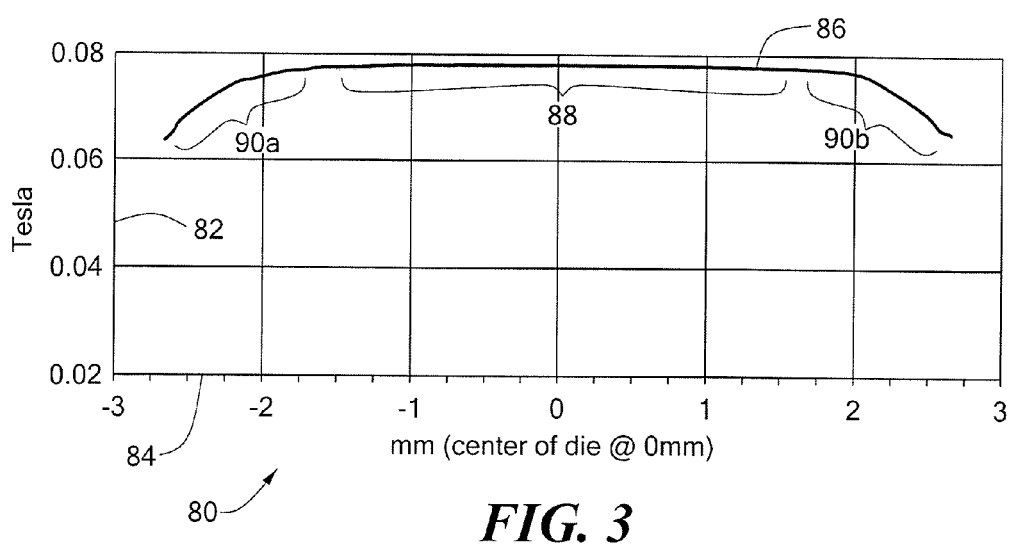
FIG. 3 is a graph showing a magnetic field of the current sensors of FIG. 1, 2 or 2A along an x direction.

Referring to FIG. 3, a graph 80 illustrates the magnetic flux density along the x-axis 19 of the Hall effect element 14a of FIG. 1 or along the x-axis 62 of the Hall effect element 58a of FIGS. 2 and 2A when about one hundred Amperes is passed through the conductor 16 of FIG. 1 or through the conductor (not shown) passing through the hole 56 of FIGS. 2 and 2A. A center of the Hall effect element 14a (FIG. 1) or a center of the Hall effect element 58a (FIGS. 2, 2A) corresponds to zero millimeters on the x-axes 19, 62.

A magnetic flux curve 86 can be characterized as having a central portion 88 that is essentially flat and inclined end portions 90a, 90b. Consideration of the curve 86 reveals that the magnetic flux is substantially constant in the central portion 88 for a span on the order of 4 mm centered about the centers of the Hall effect elements 14a, 58a. Portions of the Hall effect elements 14a, 58a located more than 2 mm from their centers along the x-axes 19, 62 experience reduced magnetic flux density. The illustrative Hall effect elements 14a, 58a have an x-axis width on the order of 0.2 mm, centered on sensor die typically having dimensions of approximately 1.6 mm by 3 mm, and therefore, the entire Hall effect elements 14a, 58a lie in the central portion 88. The width of the central portion 88 is substantially greater than the width of the Hall effect elements 14a, 58a, and the Hall effect elements 14a, 58a are sufficiently centered within the central portion 88 to ensure that the Hall effect elements 14a, 58a are within the greatest amount of magnetic field.

It will be appreciated that the dimensions of the magnetic cores 24, 52 relative to the Hall effect elements 14a, 58a affect the uniformity of the flux density across the Hall effect elements 14a, 58a in the direction of the x-axes 19, 62. In particular, the wider the magnetic core 24 (i.e., the greater the width w4), relative to the width of the Hall effect element 14a in the x direction 19, and the thicker the flux concentrator 52 in the x direction 62 relative to a width of the Hall effect element 58a in the x direction 62, the longer the central portion 88 of the curve 86, whereas, the narrower the magnetic core, the shorter the central portion 88.

Curve 86 presumes that the magnetic cores 24, 52 and Hall effect elements 14a, 58a are centered relative to one another in the x directions 19, 62, respectively. Movement of the Hall effect elements 14a, 58a relative to the magnetic cores 24, 52 along the x-axes 19, 62 would result in the curve 86 moving along the axis 84 and thus, result in areas of the Hall effect elements 14a, 58a even closer to their centers than 2 mm, experiencing significantly reduced flux density. This effect highlights the desirability of restricting relative movement of the Hall effect sensors 12, 58 and the magnetic cores 24, 52. Further, since there is a tolerance associated with the location of the Hall effect elements 14a, 58a within the Hall effect sensors 12, 58, respectively, fixing the position of the Hall effect sensors 12, 58 relative to the magnetic cores 24, 52 is important Referring now to FIG. 3A, a graph 100 illustrates the magnetic flux density along the y-axes 20, 64 of the Hall effect elements 14a, 58a when about one hundred Amperes is passed through the conductor 16 of FIG. 1 or through the conductor (not shown) passing through the hole 54 of FIGS. 2 and 2A. A center of the Hall effect elements 14a, 58a corresponds to zero millimeters on the axis 104.

A magnetic flux curve 106 can be characterized as having a central portion 108 that is essentially flat and inclined end portions 110a, 110b. Consideration of the curve 106 reveals that the magnetic flux is substantially constant in the central portion 108 for a span on the order of 2.5 mm centered about the center the Hall effect elements 14a, 58a. Portions of the Hall effect elements 14a, 58a located more than 1.25 mm from their centers along the y-axes 20, 64 experience reduced magnetic flux density. The illustrative Hall effect elements 14a, 58a have a y-axis width on the order of 0.2 mm, centered on sensor die typically having dimensions of approximately 1.6 mm by 3 mm, and therefore the entire Hall effect elements 14a, 58a lie in the central portion 108. The width of central portion 108 is substantially greater than the width of the Hall effect element 14a, 58a, and the Hall effect elements 14a, 58a are sufficiently centered within the central portion 108 to ensure that the Hall effect elements 14a, 58a are within the greatest amount of magnetic field.

It will be appreciated that the dimensions of the magnetic cores 24, 52 relative to the Hall effect elements 14a, 58a significantly affect the uniformity of the flux density across the Hall effect elements 14a, 58a in the direction of the y-axes 20, 64. In particular, the deeper the magnetic cores 24, 52 in the y directions 20, 64, relative to the width of the Hall effect elements 14a, 58a, the longer the central portion 108 of the curve 106, whereas, the shallower the magnetic core, the shorter the central portion 108.

Curve 106 presumes that the magnetic cores 24, 52 and Hall effect elements 14, 58a are centered relative to one another in the y directions 20, 64. Movement of the Hall effect elements 14a, 58a relative to the magnetic cores 24, 52 along the y-axes 20, 64 would result in the curve 106 moving along the axis 104 and thus, result in areas of the Hall effect elements 14a, 58a, even closer to their centers than 1.25 mm, experiencing significantly reduced flux density. This effect again highlights the desirability of restricting relative movement of the Hall effect sensor 12, 58 relative to the magnetic cores 24, 52.

Figure 4:
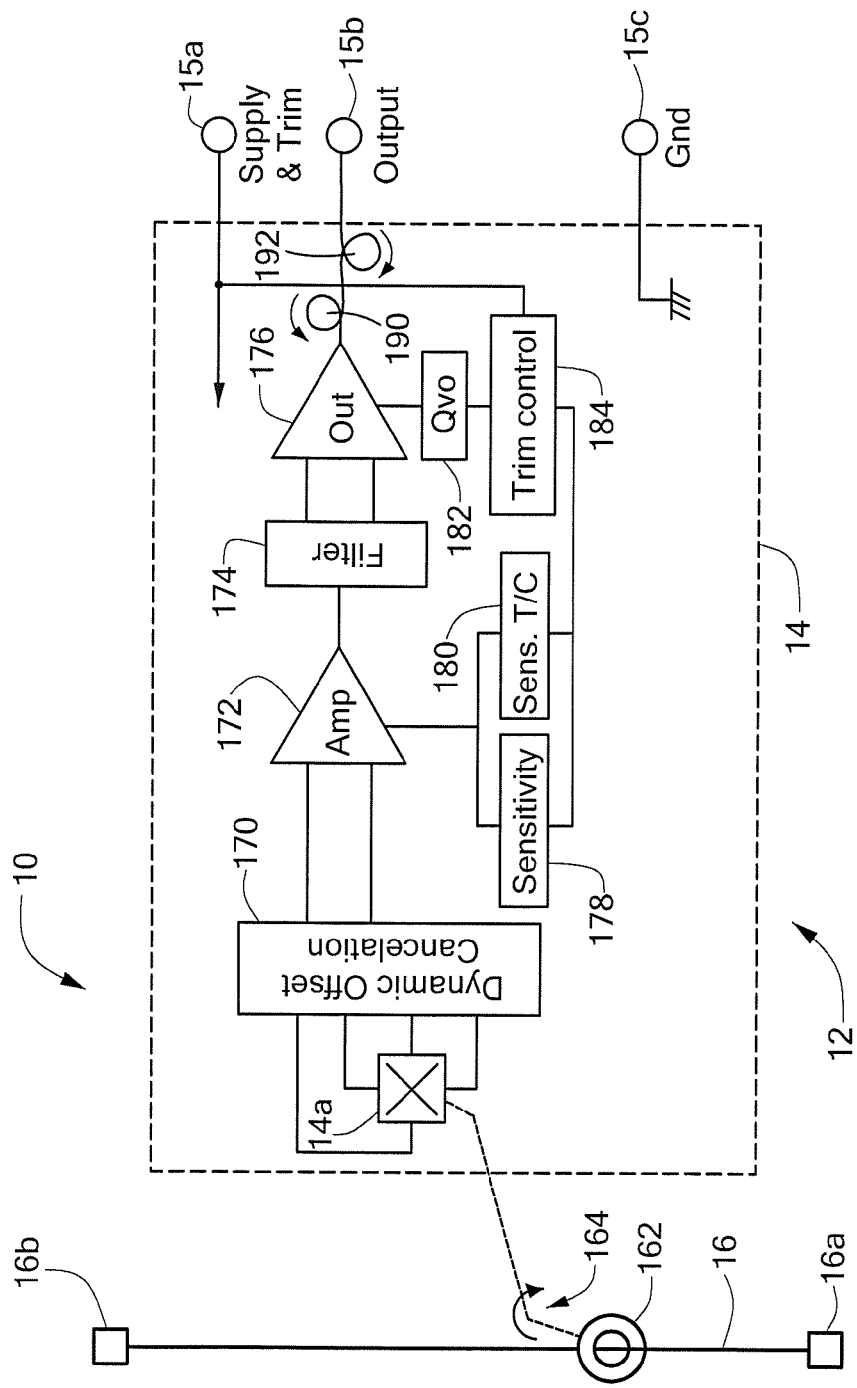
FIG. 4 is a block diagram of circuitry that can be included in the current sensors of FIG. 1, 2, or 2A, the block diagram showing a so-called circuit loop and showing a so-called compensation loop.

Referring now to FIG. 4, in which like elements of FIG. 1 are shown having like reference designations, a schematic representation of the exemplary Hall effect current sensor 10 of FIG. 1 includes the conductor 16 represented by a line having circuit board mounting mechanisms 16a, 16b, and the magnetic core 24 here represented by a toroid 162. While the representation of FIG. 4 is described in conjunction with FIG. 1, it will be understood that the same description and circuits can apply to the magnetic field sensor 50 of FIGS. 2-2A. The illustrative Hall effect sensor 12 includes the sensor die 14 and leads 15, here labeled 15a, 15b, and 15c. Lead 15a provides a power connection to the Hall effect current sensor 12, lead 15b provides a connection to the current sensor output signal, and lead 15c provides a reference, or ground connection to the current sensor.

The Hall effect element 14a senses a magnetic field 164 induced by a current flowing in the conductor 16, producing a voltage in proportion to the magnetic field 164. The Hall effect element 14a is coupled to a dynamic offset cancellation circuit 170, which provides a DC offset adjustment for DC voltage errors associated with the Hall effect element 14a. When the current through the conductor 16 is zero, the output of the dynamic offset cancellation circuit 170 is adjusted to be zero.

The dynamic offset cancellation circuit 170 is coupled to an amplifier 172 that amplifies the offset adjusted Hall output signal. The amplifier 172 is coupled to a filter 174 that can be a low pass filter, a high pass filter, a band pass filter, and/or a notch filter. The filter is selected in accordance with a variety of factors including, but not limited to, desired response time, the frequency spectrum of the noise associated with the Hall effect element 14a, the dynamic offset cancellation circuit 170, and the amplifier 172. In one particular embodiment, the filter 174 is a low pass filter. The filter 174 is coupled to an output driver 176 that provides an enhanced power output for transmission to other electronics (not shown).

A trim control circuit 184 is coupled to lead 15a through which power is provided during operation. Lead 15a also permits various current sensor parameters to be trimmed, typically during manufacture. To this end, the trim control circuit 184 includes one or more counters enabled by an appropriate signal applied to the lead 15a.

The trim control circuit 184 is coupled to a quiescent output voltage (Qvo) circuit 182. The quiescent output voltage is the voltage at output lead 15b when the current through conductor 16 is zero. Nominally, for a unipolar supply voltage, Qvo is equal to Vcc/2. Qvo can be trimmed by applying a suitable trim signal through the lead 15a to a first trim control circuit counter within the trim control circuit 184 which, in turn, controls a digital-to-analog converter (DAC) within the Qvo circuit 182.

The trim control circuit 184 is further coupled to a sensitivity adjustment circuit 178. The sensitivity adjustment circuit 178 permits adjustment of the gain of the amplifier 172 in order to adjust the sensitivity of the current sensor 10. The sensitivity can be trimmed by applying a suitable trim signal through the lead 15a to a second trim control circuit counter within the trim control circuit 184 which, in turn, controls a DAC within the sensitivity adjustment circuit 178.

The trim control circuit 184 is further coupled to a sensitivity temperature compensation circuit 180. The sensitivity temperature compensation circuit 180 permits adjustment of the gain of the amplifier 172 in order to compensate for gain variations due to temperature. The sensitivity temperature compensation can be trimmed by applying a suitable trim signal through the lead 15a to a third trim control circuit counter within the trim control circuit 184 which, in turn, controls a DAC within the sensitivity temperature compensation circuit 180.

An output signal from the output driver 176 experiences two conductive loops in conjunction with its path from the output driver to the signal output pin 15b. A first loop 190, referred to herein as a "circuit loop," has a first rotation direction indicated by an arrow, and a second loop 192, referred to herein as a "compensation loop," has a second different and opposite rotation direction indicated by another arrow. The circuit loop 190 is described more fully below in conjunction with FIG. 5. The compensation loop is described more fully below in conjunction with FIGS. 7-12B.

Let it suffice here to say that the circuit loop 190 is naturally occurring in the sensor die 14 due to layout of circuits on the circuit die 14. The circuit loop 190 tends to generate a transient signal when the circuit loop directly experiences a rapid change of magnetic field as may be generated by a rapid change of current passing through the conductor 16. The compensation loop 192 is a physical conductive loop having a variety of configurations that can be provided to cancel or reduce the transient signal that forms as a result of the circuit loop 190.

Figure 7:
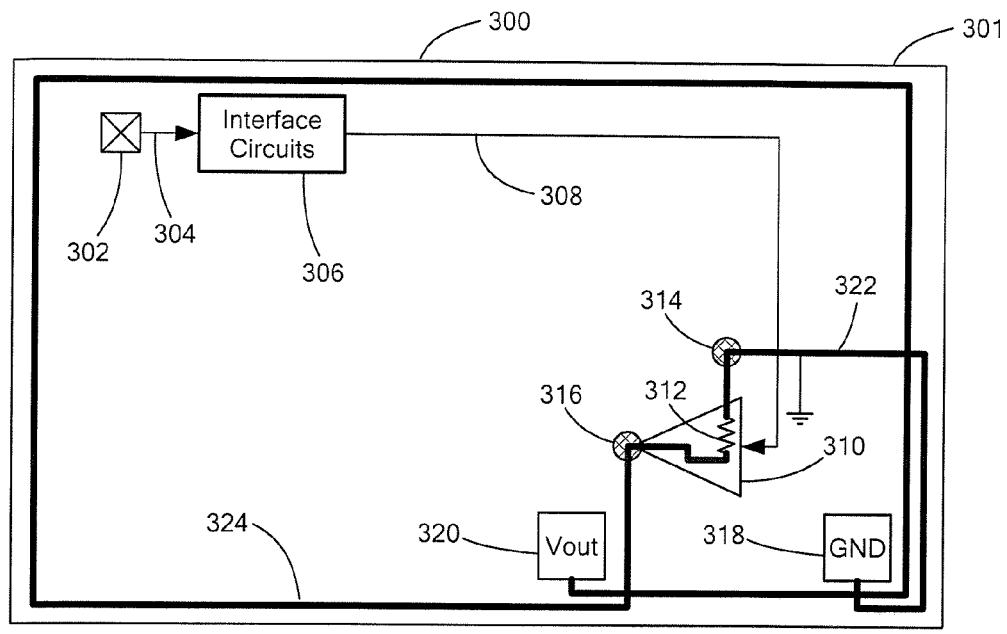
FIG. 7 is block diagram showing a circuit die having a compensation loop on a signal side of an output amplifier.

It will be appreciated that the circuitry shown in FIG. 4 is illustrative only of exemplary circuitry that may be associated with and integrated into a Hall effect current sensor, like the Hall effect current sensor 10 of FIG. 1. In another embodiment, additional circuitry may be provided for converting the current sensor into a "digital fuse" which provides a high or low output signal depending on whether the magnetic field 164 induced by the current through the conductor 16 is greater or less than a predetermined threshold level. The additional circuitry for this alternative embodiment can include a comparator and/or a latch, and/or a relay. An exemplary embodiment of a digital fuse is shown in FIG. 7.

Further, since the conductor connections 16a, 16b are electrically isolated from the current sensor leads 15a, 15b, and 15c, the current sensor 10 can be used in applications requiring electrical isolation without the use of opto-isolators or other isolating techniques, such as transformers.

Figure 4A:
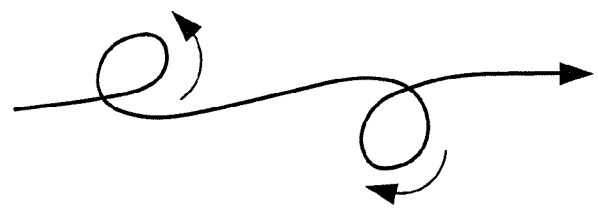
FIGS. 4A-4C are pictorial diagrams showing two loops, looping in opposite directions, coupled in a variety of series arrangements.

Referring now to FIG. 4A, the two loops 190, 192 of FIG. 4 are again shown but with better clarity. The two loops are coupled in a series arrangement, a path from left to right rotating counterclockwise in the first loop and the path rotating clockwise in the second loop. Both of the loops are shown to be closed loops.

Figure 4B:
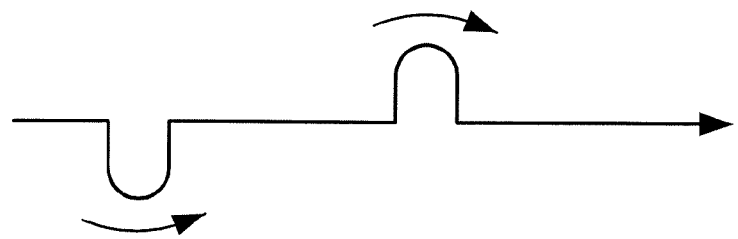

Referring now to FIG. 4B, two different loops are shown and are again coupled in a series arrangement. The loops are open loops. As used herein, the term "loop" refers to both open loops and to closed loops, and more particularly, to any conductor that takes any curved path through any number of degrees, for example, bending through ninety degrees.

As in FIG. 4B, a path from left to right rotates counterclockwise in the first loop and the path rotates clockwise in the second loop.

Figure 4C:
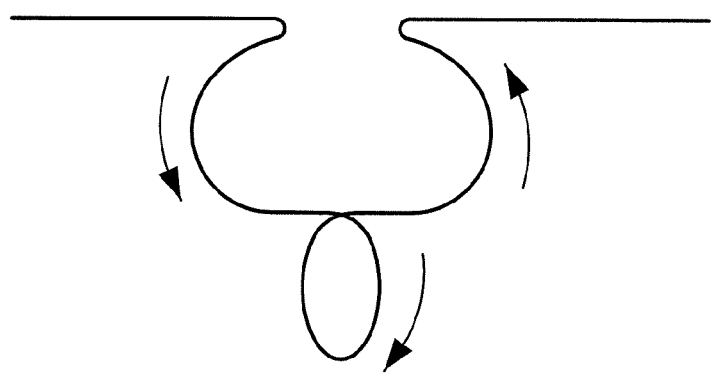

Referring now to FIG. 4C, two different loops are again coupled in a series arrangement, a second loop intermediate to the first loop.

A path from left to right rotates counterclockwise in a first portion the first loop, the path rotates clockwise in the second loop, and the path rotates counterclockwise again in a second portion the first loop. It will, therefore, be understood that the term "series arrangement" when referring to a coupling of two loops can be a coupling of the loops, one after the other, or a coupling wherein a second loop is intermediate to the first loop.

While the path through the first loop is shown to rotate counterclockwise and the path through the second loop is shown to rotate clockwise, the reverse is also possible. Also, while rotations in different direction are shown, and such is the case in embodiments shown below as will be apparent, series connected loops can also have paths that rotate in the same direction.

In FIGS. 5 and 7-12B below, magnetic field sensor are shown without flux concentrators for clarity. However, preferably, all of the magnetic field sensors of FIGS. 5 and 7-12B include a respective flux concentrator, for example, a flux concentrator having the form of one of those shown in FIGS. 1, 2, and 2A.

Figure 5:
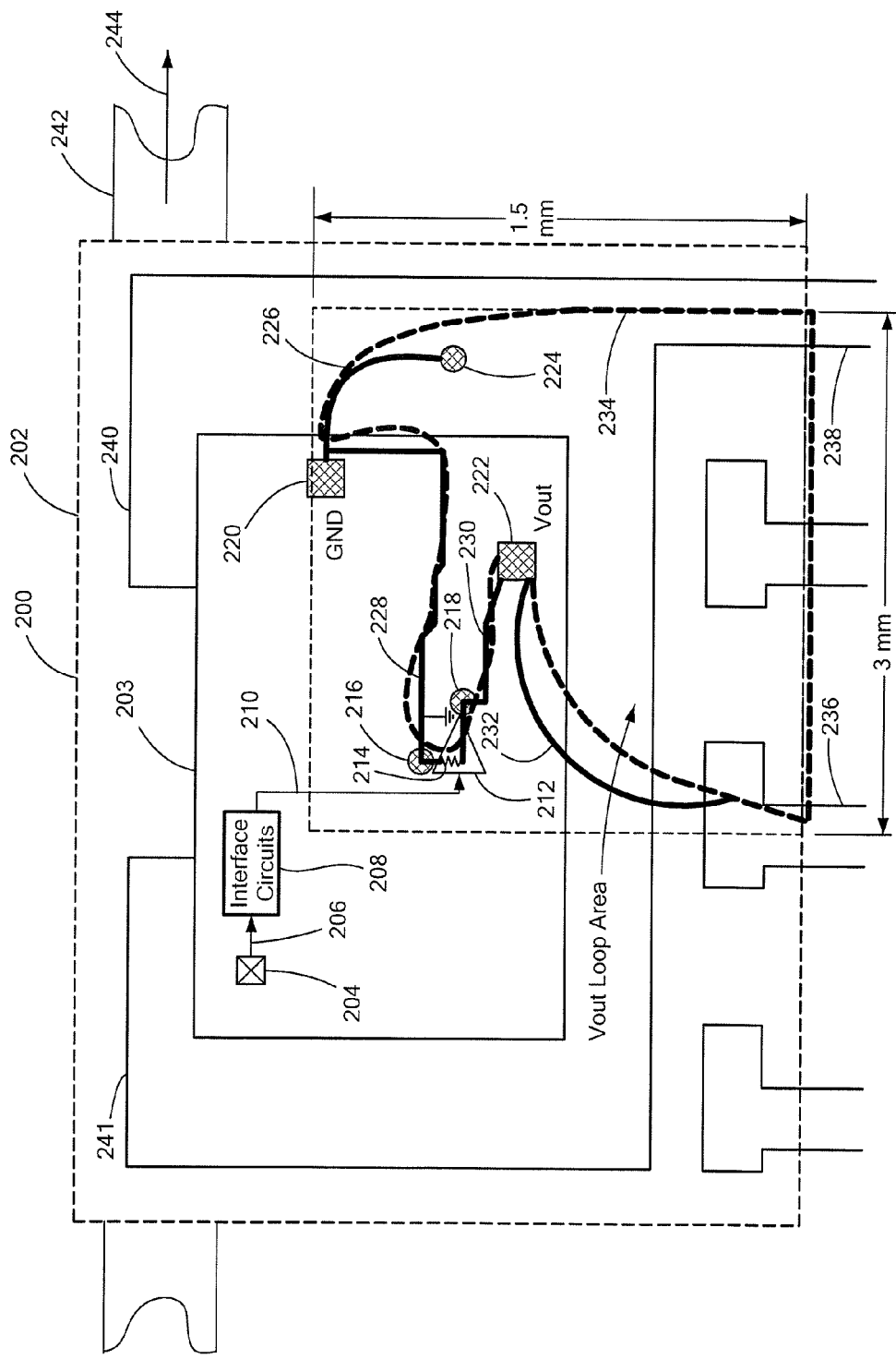
FIG. 5 is block diagram showing a circuit loop occurring in a prior art magnetic field sensor, here in a current sensor.

Referring now to FIG. 5, a magnetic field sensor 200 is shown without a flux concentrator. The magnetic field sensor 200 can include a circuit die 203 and a lead frame 240 disposed within a molded package 202. The circuit die 203 can include a Hall effect element 204 configured to generate a magnetic field signal carried on a conductor 206. The signal carried by the conductor 206 is responsive to a current 244 flowing through a conductor 242 disposed near to the Hall effect element 204. Interface circuits 208 are coupled to receive the magnetic field signal carried by the conductor 206 and configured to generate an interface signal carried by a conductor 210. An output amplifier (or buffer) 212 is coupled to receive the interface signal carried on the conductor 210. The interface circuits 208 and the output amplifier 212 will be readily understood from the above discussion in conjunction with FIG. 4.

The output amplifier 212 includes a circuit ground node 216 and a circuit output node 218. The circuit output node 218 is coupled to the circuit ground node 216 via an internal resistance 214 within the output amplifier 212.

A ground circuit trace 228 has first and second ends, wherein the first end of the ground circuit trace 228 is coupled to the circuit ground node 216. A ground bonding pad 220 is coupled to the second end of the ground circuit trace 228. An output signal circuit trace 230 has first and second ends, wherein the first end of the output signal circuit trace 230 is coupled to the circuit output node 218. An output signal bonding pad 222 is coupled to the second end of the output signal circuit trace 230.

A signal bond wire 232 is coupled between the output signal bonding pad 222 and a signal output pin 236, which is part of the lead frame 240. A ground bond wire 226 is coupled between the ground bonding pad 220 and a ground node 234 on a base plate 241, which is part of the lead frame 240, which is coupled to a ground pin 238, which is part of the lead frame 240.

The ground bond wire 226, the ground circuit trace 228, the resistance 214, the output signal circuit trace 230, and the output signal bond wire 232 form parts of a so-called "circuit loop" 234, shown as a dashed line. The circuit loop 234 can be symbolically closed by way of a horizontal line shown at the lower perimeter of the molded package 202.

It will be understood that a conductive loop tends to form a voltage at ends thereof in response to a rapidly changing magnetic field as may be generated by the current 244 when rapidly changing. The voltage tends to result in a transient and unwanted signal shown and described below in conjunction with FIGS. 6 and 6A.

The generated voltage in a loop is described by Faraday's Law:

$V=-N(d\Phi/dt)$ where:
  N is the number of turns of a loop
  $\Phi$ is magnetic flux; and
  $d\Phi/dt$ is a rate of change of magnetic flux.
It will be understood that:
  $\Phi=BA$ if B is uniform and perpendicular to a plan of the loop
where: B is flux density; and
  A is area of the loop. (Note that, for an open loop, the area can be found by connecting the ends of the loop with a line, for example, a straight line.)
  Thus, the induced voltage in a loop is proportional to a rate of change of magnetic flux, related to a number of turns of the loop, and related to an area of the loop.

As shown, the circuit loop 234 is bounded within a rectangle that is about 3 mm×about 1.5 mm. The circuit loop, which does not fill the entire rectangular area, has a circuit loop interior area that is about 3.6 square millimeters. A path traversing the circuit loop 234 in a direction from the ground pin 238 to the signal output pin 236 has a circuit loop rotation direction, which can be counterclockwise as shown, or which can be clockwise in other arrangements.

It will be understood that the boundaries of the circuit loop, found by inspection of an irregular shape, may not be entirely correct. Thus, there may be one or more trial and error circuit die fabrication attempts to establish the area of the circuit loop.

Figure 6:
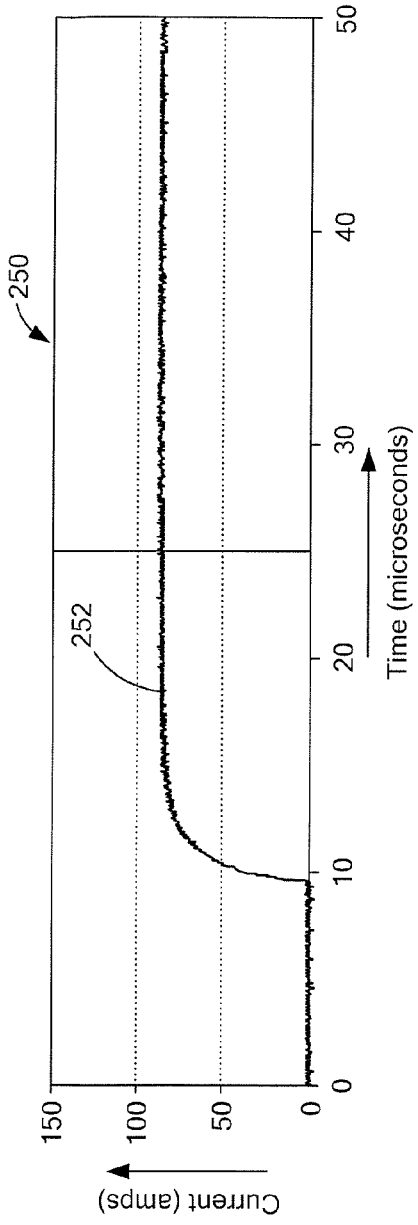
FIG. 6 is a graph showing a rapidly changing current sensed by the prior art current sensor of FIG. 5.

Referring now to FIG. 6, a graph 250 has a horizontal axis in units of time in microseconds and a vertical axis in units of electrical current in Amperes. A signal 252 has a transition region representative of a rapidly changing current as may be carried by the conductor 242 of FIG. 5.

Figure 6A:
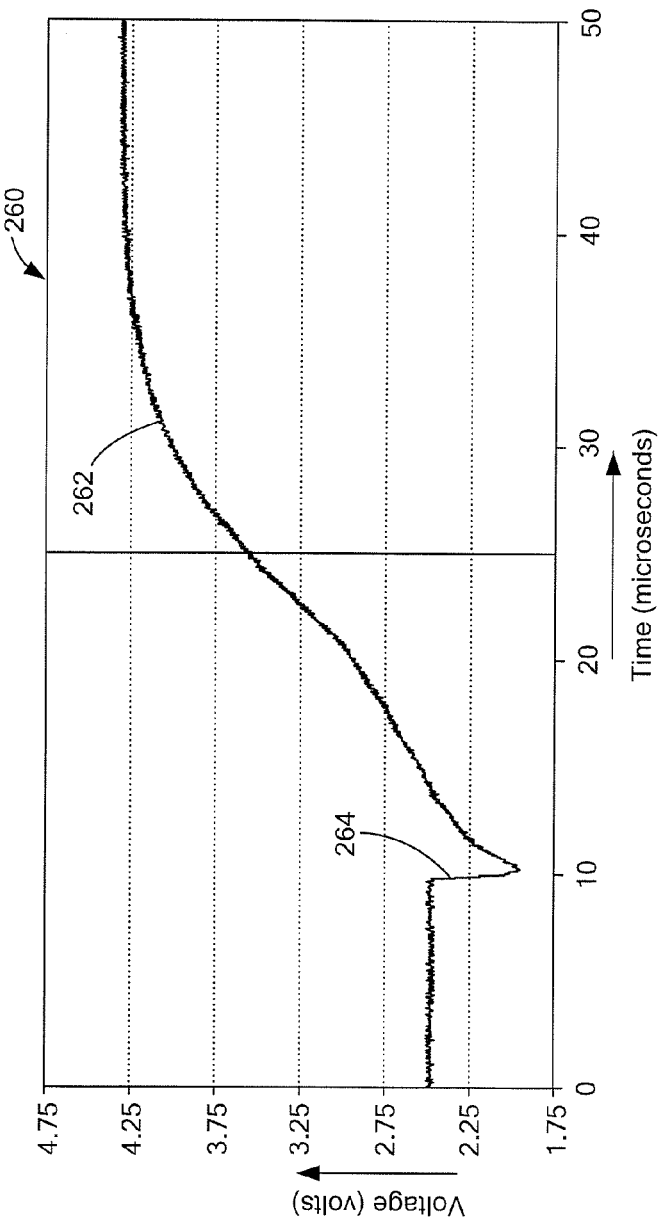
FIG. 6A is a graph showing a rapidly changing output signal generated by the prior art current sensor of FIG. 5 when experiencing the rapidly changing current of FIG. 6, showing an unwanted transient signal portion.

Referring now to FIG. 6A, a graph 260 has a horizontal axis in units of time in microseconds and a vertical axis in units of voltage in volts. In response to the current signal 252 of FIG. 6, a signal 262 is representative of an output signal as may be generated at the output signal pin 236 of FIG. 5. The signal 262 has an unwanted transient signal portion 264, not representative of the current signal 252 of FIG. 6, shown as a downward transition coincident with the onset of the transition region of the signal 252 of FIG. 6.

It has been recognized by the invention herein that the transient signal portion 264 is generated by the circuit loop 234 of FIG. 5 as it experiences a high rate of change of magnetic field (or a high rate of change of magnetic flux). In other words, the transient signal portion 264 is generated as a result of a physical conductive loop at or near the output amplifier of the magnetic field sensor 200 of FIG. 5.

As described above, others have attempted to remove the transient signal 264 by way of filters or the like. However, these techniques tend to slow down a response rate of the signal 262. It has not been previously known that the transient signal is the result of the above-described circuit loop as it experiences a high rate of change of magnetic field.

Figure 6B:
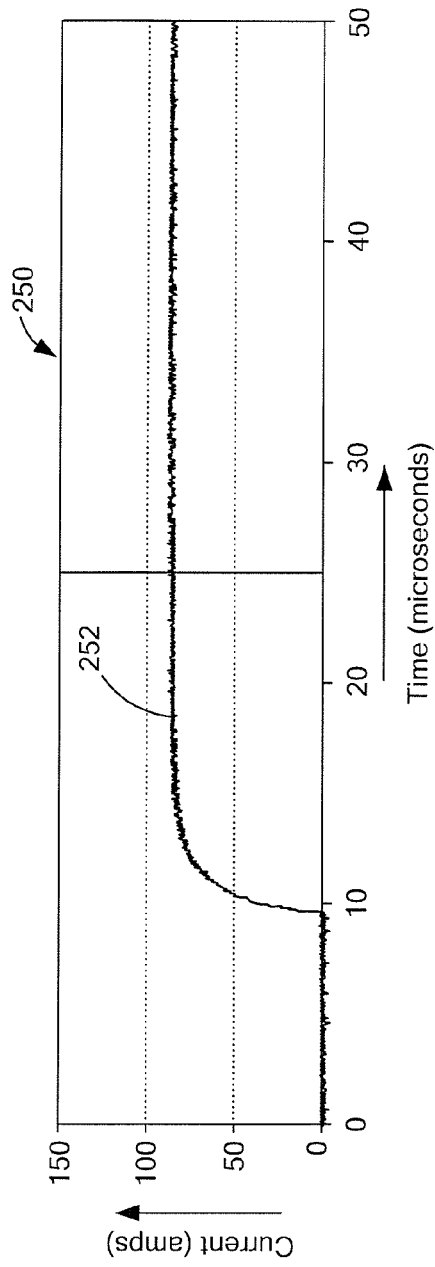
FIG. 6B is a graph showing a rapidly changing current sensed by a current sensor of the present invention.

Referring now to FIG. 6B, the graph 250 of FIG. 6 is again shown.

Figure 6C:
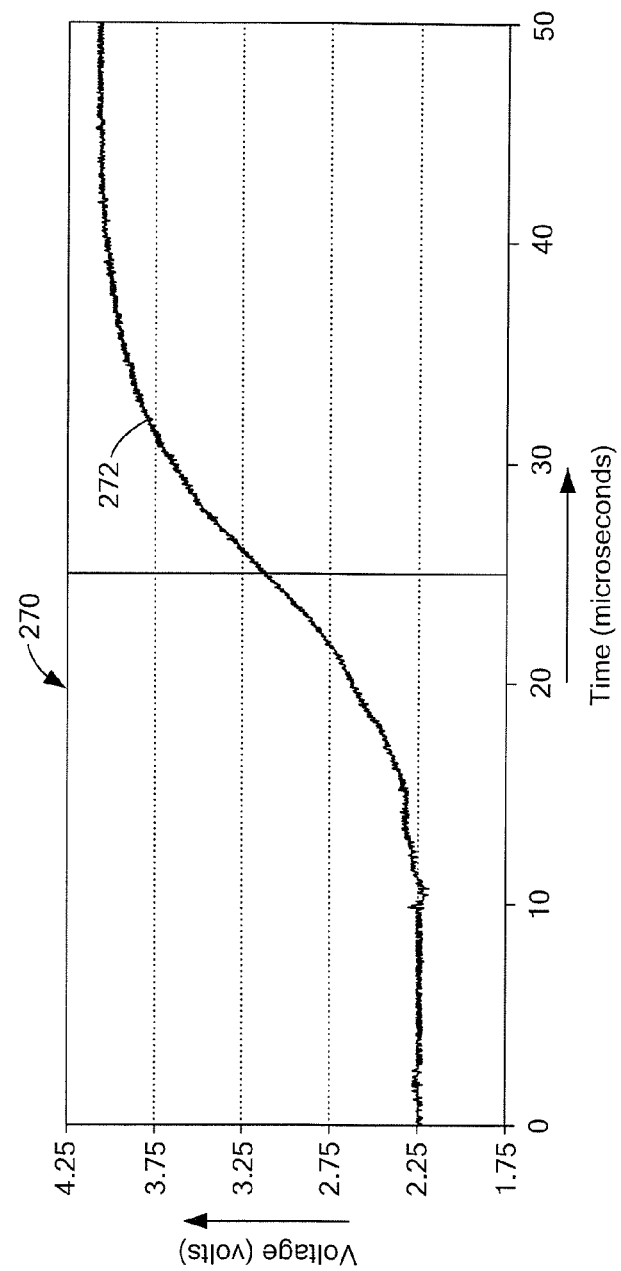
FIG. 6C is a graph showing a rapidly changing output signal generated by the current sensor of the present invention when experiencing the rapidly changing current of FIG. 6B, showing no unwanted transient signal portion or a reduced amplitude transient signal portion.

Referring now to FIG. 6C, a graph 270 has a horizontal axis in units of time in microseconds and a vertical axis in units of voltage in volts. In response to the current signal 252 of FIG. 6B, a signal 272 is representative of an output signal as may be generated at an output pin of circuits shown and described below, which include a compensation loop coupled in series with the circuit loop 234 of FIG. 5. The signal 262 has no transient signal portion like the transient signal portion 264 of FIG. 6A.

Referring now to FIG. 7, a circuit die 300 can include a Hall effect element 302 configured to generate a magnetic field signal carried on a conductor 304. Interface circuits 306 are coupled to receive the magnetic field signal carried by the conductor 304 and configured to generate an interface signal carried by a conductor 308. An output amplifier (or buffer) 310 is coupled to receive the interface signal carried on the conductor 308.

The output amplifier 310 includes a circuit ground node 314 and a circuit output node 316. The circuit output node 316 is coupled to the circuit ground node 314 via an internal resistance 312 within the output amplifier 310.

A ground circuit trace 322 has first and second ends, wherein the first end of the ground circuit trace 322 is coupled to the circuit ground node 314. A ground bonding pad 318 is coupled to the second end of the ground circuit trace 322.

An output signal circuit trace 324 has first and second ends, wherein the first end of the output signal circuit trace 324 is coupled to the circuit output node 316. An output signal bonding pad 320 is coupled to the second end of the output signal circuit trace 324.

The output signal circuit trace 324, unlike the output signal circuit trace 230 of FIG. 5, takes a circular route in a "compensation loop" to reach the output signal bonding pad 320. A direction of the compensation loop 324 from the circuit output node 318 to the output signal bonding pad 320 (here clockwise) takes a direction opposite to the above-described circuit loop 234 of FIG. 5.

It will be recognized that the compensation loop 324 is coupled in a series arrangement with a circuit loop (not shown), which is the same as or similar to the circuit loop 234 of FIG. 5. Preferably, the compensation loop 324 has an interior area about the same as the interior area of the circuit loop 234 of FIG. 5.

It will be recognized that the compensation loop 324 and the circuit loop 234 of FIG. 5 have opposite rotation directions and tend to respond with transient signals having opposite directions when the compensation loop 324 and the circuit loop 234 experience a large rate of change of magnetic field. Furthermore, if the compensation loop 324 and the circuit loop 234 both have about the same interior area and if the compensation loop 324 and the circuit loop 234 both experience about the same rapidly changing magnetic field, then the compensation loop 324 will tend to reduce or cancel the transient signal generated in the circuit loop 234.

Figure 3A:
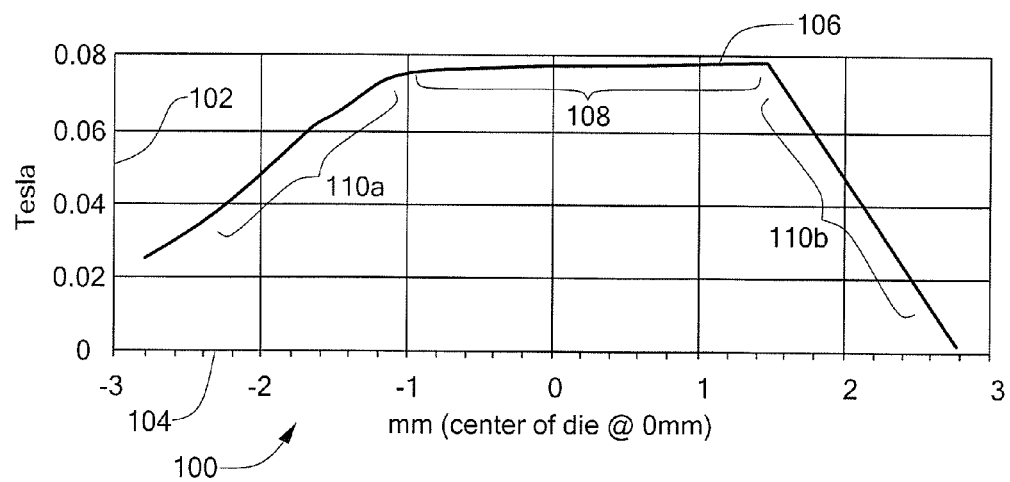
FIG. 3A is a graph showing a magnetic field of the current sensors of FIG. 1, 2, or 2A along a y direction.

Particularly when using a flux concentrator proximate to the circuit die 300, as will be apparent from the discussion above in conjunction with FIGS. 3 and 3A, the compensation loop 324 will tend to experience the same magnetic field as the circuit loop 234. However, even if the compensation loop 324 does not experience the same rapidly changing magnetic field as the circuit loop 234 of FIG. 5, an area of the compensation loop 324 or an area of the circuit loop 234 can be designed or adjusted accordingly to provide the cancellation or reduction results.

Figure 8:
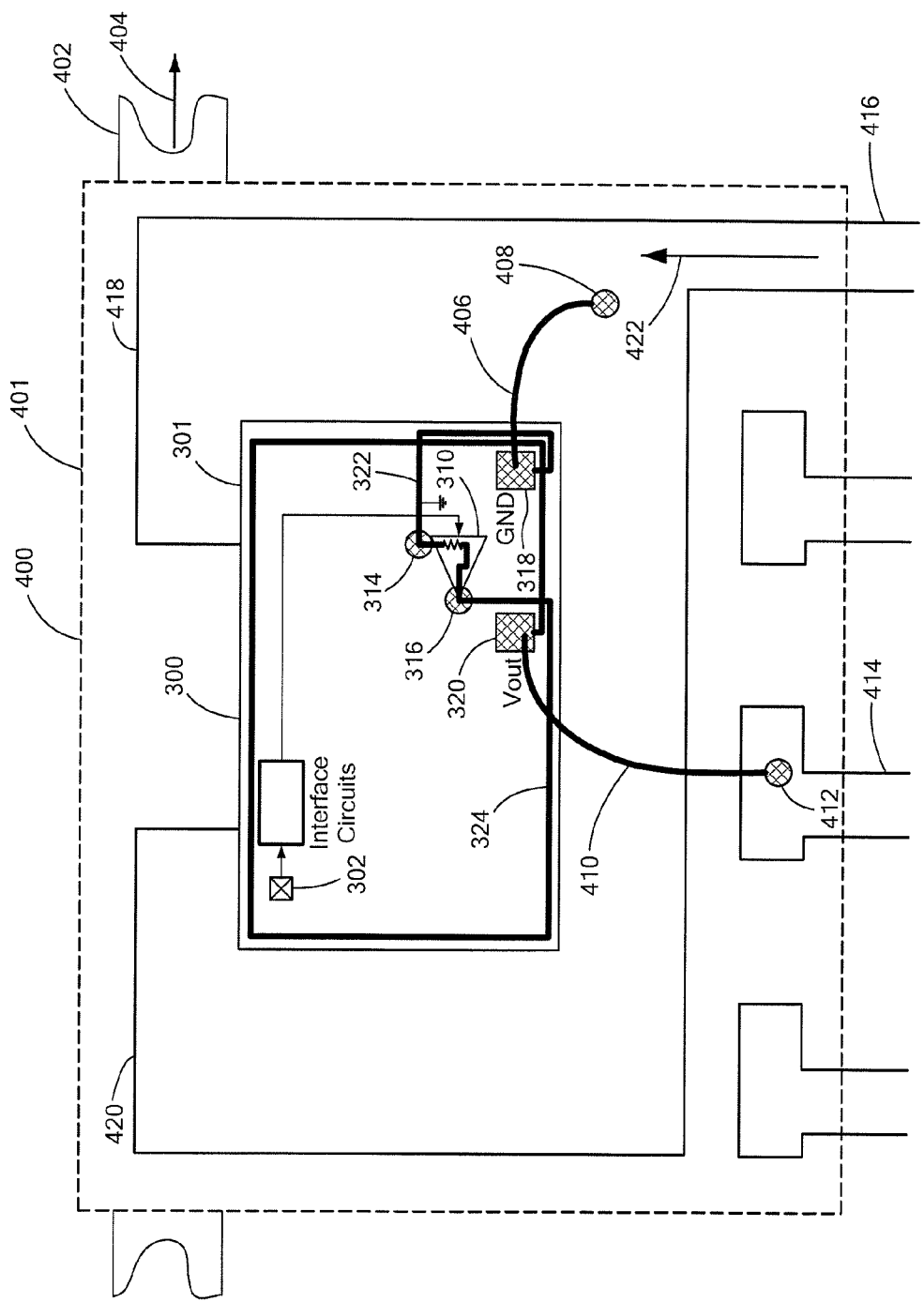
FIG. 8 is a block diagram showing the circuit die of FIG. 7 coupled to a lead frame in an integrated circuit package.

The circuit die 300 is shown in FIG. 8 below when coupled into a magnetic field sensor, or more particularly, a current sensor.

Figure 7A:
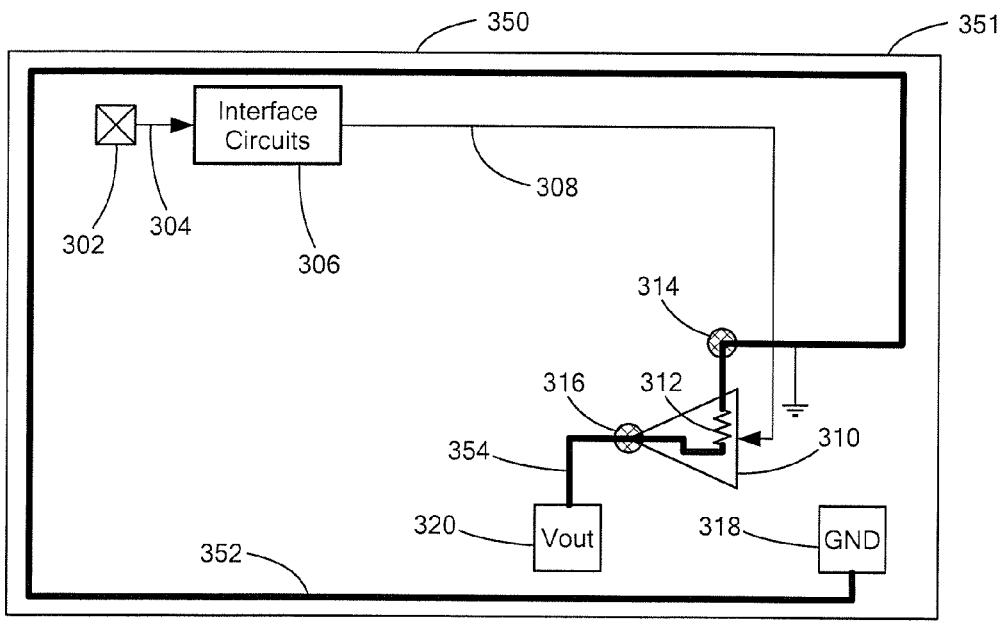
FIG. 7A is block diagram showing a circuit die having a compensation loop on a ground side of an output amplifier.

Referring now to FIG. 7A, in which like elements of FIG. 7 are shown having like reference designations, a circuit die 350 can include the Hall effect element 302 configured to generate the magnetic field signal carried on the conductor 304. The interface circuits 306 are coupled to receive the magnetic field signal carried by the conductor 304 and configured to generate the interface signal carried by the conductor 308. The output amplifier (or buffer) 310 is coupled to receive the interface signal carried on the conductor 308.

The output amplifier 310 includes the circuit ground node 314 and the circuit output node 316. The circuit output node 316 is coupled to the circuit ground node 314 via the internal resistance 312 within the output amplifier 310.

A ground circuit trace 352, which is longer than the ground circuit trace 322 of FIG. 7, has first and second ends, wherein the first end of the ground circuit trace 352 is coupled to the circuit ground node 314. A ground bonding pad 318 is coupled to the second end of the ground circuit trace 352.

An output signal circuit trace 354, which is shorter than the output signal circuit trace 324 of FIG. 7, has first and second ends, wherein the first end of the output signal circuit trace 354 is coupled to the circuit output node 316. An output signal bonding pad 320 is coupled to the second end of the output signal circuit trace 354.

The ground circuit trace 352, unlike the ground circuit trace 228 of FIG. 5, takes a circular route in a "compensation loop" to reach the ground bonding pad 318. A direction of the compensation loop 354 from the ground bonding pad 318 to the circuit ground node 314 (here clockwise) takes a direction opposite to the above-described circuit loop 234 of FIG. 5.

It will be recognized that the compensation loop 352 is coupled in a series arrangement with a circuit loop (not shown), which is the same as or similar to the circuit loop 234 of FIG. 5. Preferably, the compensation loop 352 has an interior area about the same as the interior area of the circuit loop 234 of FIG. 5.

It will be recognized that the compensation loop 352 and the circuit loop 234 of FIG. 5 have opposite rotation directions and tend to respond with transient signals having opposite directions when the compensation loop 352 and the circuit loop 234 experience a large rate of change of magnetic field. Furthermore, if the compensation loop 352 and the circuit loop 234 both have about the same interior area and if the compensation loop 352 and the circuit loop 234 both experience about the same rapidly changing magnetic field, then the compensation loop 352 will tend to reduce or cancel the transient signal generated in the circuit loop 234.

Particularly when using a flux concentrator proximate to the circuit die 350, as will be apparent from the discussion above in conjunction with FIGS. 3 and 3A, the compensation loop 352 will tend to experience the same magnetic field as the circuit loop 234. However, even if the compensation loop 352 does not experience the same rapidly changing magnetic field as the circuit loop 234 of FIG. 5, an area of the compensation loop 352 or an area of the circuit loop 234 can be designed or adjusted accordingly to provide the cancellation or reduction results.

Figure 8A:
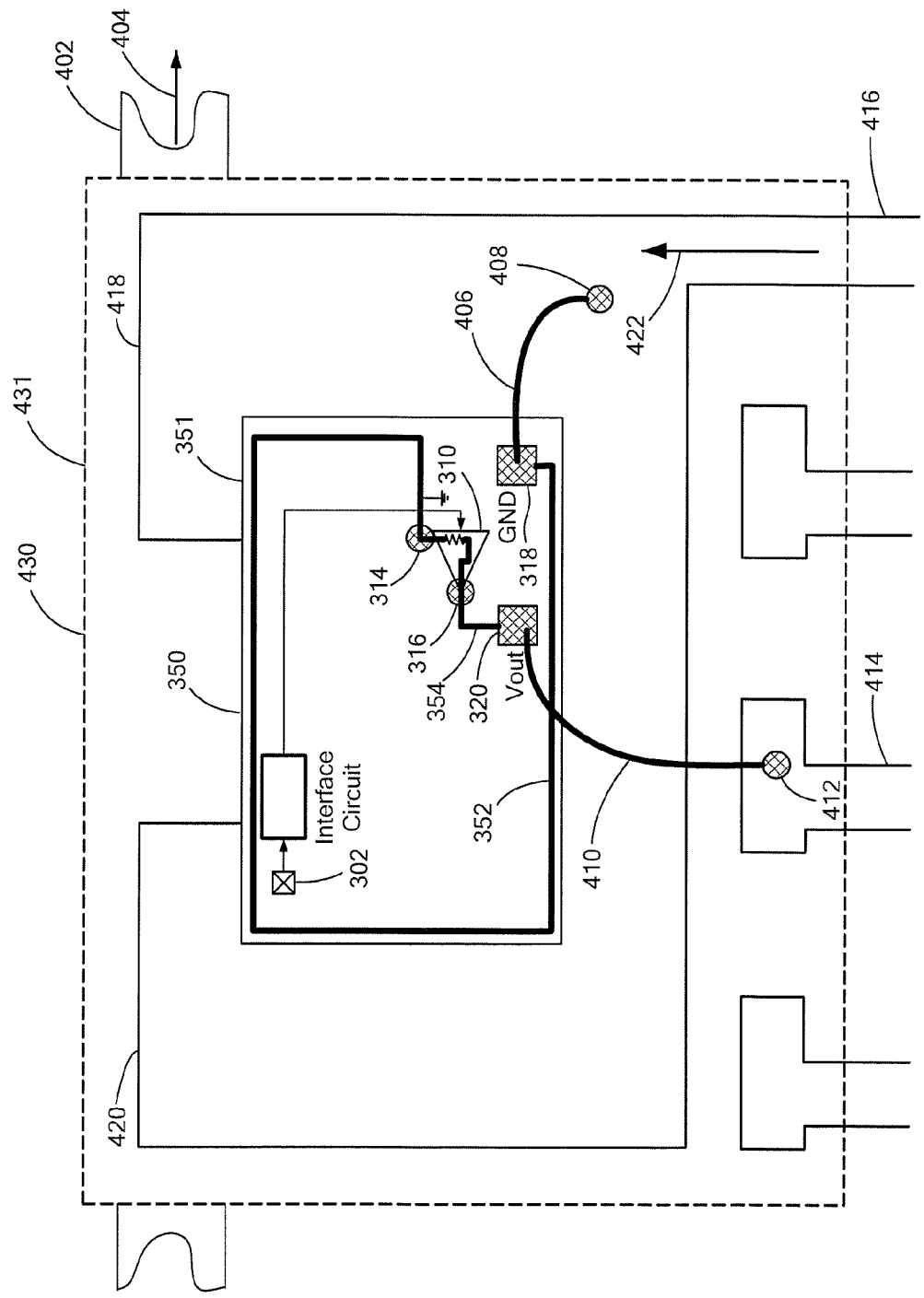
FIG. 8A is a block diagram showing the circuit die of FIG. 7A coupled to a lead frame in an integrated circuit package.

The circuit die 350 is shown in FIG. 8A below when coupled into a magnetic field sensor, or more particularly, a current sensor.

Referring now to FIG. 8, in which like elements of FIG. 7 are shown having like reference designations, the circuit die 300 of FIG. 7 is within a magnetic field sensor 400.

The magnetic field sensor 400 includes a lead frame 420 having a base plate 418, a ground pin 416 coupled to the base plate 420, and a signal output pin 414. The magnetic field sensor 400 includes the circuit die 300 of FIG. 7 disposed upon the base plate 418. The circuit die 300 includes a substrate 301. The circuit die 300 also includes the magnetic field sensing element 302 disposed upon the substrate 301 and configured to generate a magnetic field signal responsive to a magnetic field (e.g., a magnetic field generated by a current 404 flowing in a conductor 402). The circuit die 301 also includes the output circuit 310 disposed upon the substrate 301. The output circuit 310 includes the circuit ground node 314 and the circuit output node 316. The output circuit 310 is configured to generate an output signal at the circuit output node 316 responsive to the magnetic field signal. The circuit die 301 also includes the ground circuit trace 322 having first and second ends. The first end of the ground circuit trace 322 is coupled to the circuit ground node 314. The circuit die also includes the ground bonding pad 318 coupled to the second end of the ground circuit trace 322. The circuit die 301 also includes the output signal circuit trace 324 having first and second ends. The first end of the output signal circuit trace 324 is coupled to the circuit output node 316. The circuit die 301 also includes the output signal bonding pad 320 coupled to the second end of the output signal circuit trace 324. The magnetic field sensor 400 further includes a circuit loop 234 (FIG. 5). The circuit loop 234 includes a conductive path between the ground pin 416 and the signal output pin 414. The circuit loop 234 has a circuit loop interior area. The magnetic field sensor 400 further includes a compensated signal output node 412 coupled to the circuit output node 316. The magnetic field sensor 400 further includes a conductive structure, which includes a compensation loop 324 coupled in a series arrangement with the circuit loop 234 (FIG. 5). The compensation loop 324 has a compensation loop interior area. The compensation loop interior area is selected to be related to the interior area of the circuit loop 234. Also, a path traversing (see, e.g., arrow 422) the circuit loop 234 in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node 412 resulting from the circuit loop 234 experiencing a rapid change in flux of the magnetic field.

In the embodiment of FIG. 8, the compensation loop 324 is coupled between the circuit output node 316 and the compensated signal output node 414, i.e., on the signal side of the circuit loop 234. The compensation loop 324 is the same as the signal circuit trace 324.

Referring now to FIG. 8A, in which like elements of FIGS. 7A and 8 are shown having like reference designations, the circuit die 350 of FIG. 7A is within a magnetic field sensor 430, i.e., on a signal side of the circuit loop 234.

The magnetic field sensor 430 includes the lead frame 420 having the base plate 418, the ground pin 416 coupled to the base plate 420, and the signal output pin 414. The magnetic field sensor 430 includes the circuit die 350 of FIG. 7A disposed upon the base plate 418. The circuit die 350 includes a substrate 351. The circuit die 350 also includes the magnetic field sensing element 302 disposed upon the substrate 351 and configured to generate a magnetic field signal responsive to a magnetic field (e.g., a magnetic field generated by the current 404 flowing in the conductor 402). The circuit die 351 also includes the output circuit 310 disposed upon the substrate 351. The output circuit 310 includes the circuit ground node 314 and the circuit output node 316. The output circuit 310 is configured to generate an output signal at the circuit output node 316 responsive to the magnetic field signal. The circuit die 351 also includes the ground circuit trace 352 having first and second ends. The first end of the ground circuit trace 352 is coupled to the circuit ground node 314. The circuit die 351 also includes the ground bonding pad 318 coupled to the second end of the ground circuit trace 352. The circuit die 351 also includes the output signal circuit trace 354 having first and second ends. The first end of the output signal circuit trace 354 is coupled to the circuit output node 316. The circuit die also includes the output signal bonding pad 320 coupled to the second end of the output signal circuit trace 354. The magnetic field sensor 430 further includes a circuit loop 234 (FIG. 5). The circuit loop 234 includes a conductive path between the ground pin 416 and the signal output pin 414. The circuit loop 234 has a circuit loop interior area. The magnetic field sensor 430 further includes the compensated signal output node 412 coupled to the circuit output node 316. The magnetic field sensor 430 further includes a conductive structure, which includes a compensation loop 352 coupled in a series arrangement with the circuit loop 234 (FIG. 5). The compensation loop 352 has a compensation loop interior area. The compensation loop interior area is selected to be related to the interior area of the circuit loop 234 (FIG. 5). Also, a path traversing (see, e.g., arrow 422) the circuit loop 234 in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at a compensated signal output node 412 resulting from the circuit loop 234 experiencing a rapid change in flux of the magnetic field.

In the embodiment of FIG. 8A, the compensation loop 352 is coupled between a loop termination node 408 and the ground node 314, i.e., on the ground side of the circuit loop 234. The compensation loop 352 is the same as the ground circuit trace 352.

Figures below present alternate structures that achieve the above-described compensation loops, some on a signal side of the circuit loop 234 of FIG. 5, and others on the ground side.

Figure 9:
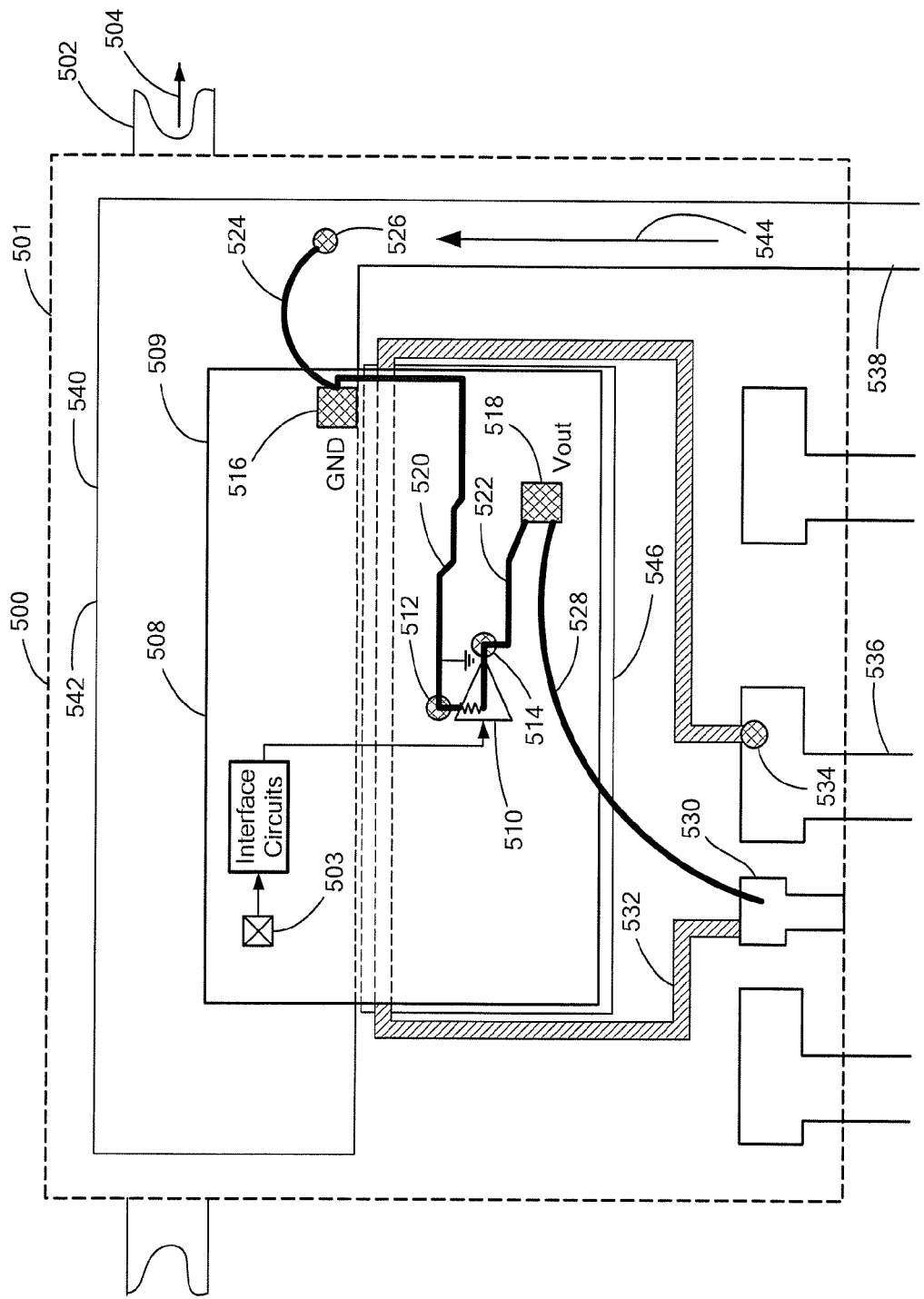
FIG. 9 is a block diagram showing a circuit die, for example, the circuit die of FIG. 5, coupled to a lead frame in an integrated circuit package, wherein the lead frame includes a compensation loop on a signal side of an output amplifier.

Referring now to FIG. 9, a magnetic field sensor 500 includes a lead frame 542 having a base plate 540, a ground pin 538 coupled to the base plate 540, and a signal output pin 536. The magnetic field sensor 500 also includes a circuit die 508 disposed upon the base plate 540. The circuit die 508 includes a substrate 509. The circuit die 508 also includes a magnetic field sensing element 503 disposed upon the substrate 509 and configured to generate a magnetic field signal responsive to a magnetic field (e.g., a magnetic field generated by a current 504 flowing in a conductor 502). The circuit die 508 also includes an output circuit 510 disposed upon the substrate 508. The output circuit 510 includes a circuit ground node 512 and a circuit output node 514. The output circuit 510 is configured to generate an output signal at the circuit output node 514 responsive to the magnetic field signal. The circuit die 508 also includes a ground circuit trace 520 having first and second ends. The first end of the ground circuit trace 520 is coupled to the circuit ground node 512. The circuit die 508 also includes a ground bonding pad 516 coupled to the second end of the ground circuit trace 520. The circuit die 508 also includes an output signal circuit trace 522 having first and second ends. The first end of the output signal circuit trace 522 is coupled to the circuit output node 514. The circuit die 508 also includes an output signal bonding pad 518 coupled to the second end of the output signal circuit trace 522. The magnetic field sensor 500 further includes a circuit loop 234 (FIG. 5). The circuit loop includes a conductive path between the ground pin 538 and the signal output pin 536. The circuit loop 234 has a circuit loop interior area. The magnetic field sensor 500 further includes a compensated signal output node 534 coupled to the circuit output node 514. The magnetic field sensor 500 further includes a conductive structure, which includes a compensation loop 532 coupled in a series arrangement with the circuit loop 234. The compensation loop 532 has a compensation loop interior area. The compensation loop interior area is selected to be related to the interior area of the circuit loop. Also, a path (see, e.g., arrow 544) traversing the circuit loop 234 in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node 534 resulting from the circuit loop experiencing a rapid change in flux of the magnetic field.

In the embodiment of FIG. 9, the compensation loop 532 is coupled between the circuit output node 514 and the compensated signal output node 534, i.e., on the signal side of the circuit loop 234.

The compensation loop 532 is formed from a portion of the lead frame 542, and in particular, a loop 532 between the signal output pin 536 and a blind pin 530. A bond wire 528 couples the signal output bonding pad 518 to the blind pin 530. An insulator 546, for example, Kapton tape, can be disposed between the compensation loop 532 and the circuit die 509.

It will be understood that, in this embodiment, the substrate 509 hangs off of the base plate 540, and therefore, is subject to breakage when the wire bond 528 is bonded. However, the output signal bonding pad 518 can be moved so as to be over the base plate 540 in order to reduce the chance of substrate breakage.

The magnetic field sensor is molded into a molded package 501. In some arrangements, a double molding process can be used to support the substrate 509 during the wire bonding of the wire bond 528. Double molding is further described below in conjunction with FIGS. 11 and 11A.

Figure 9A:
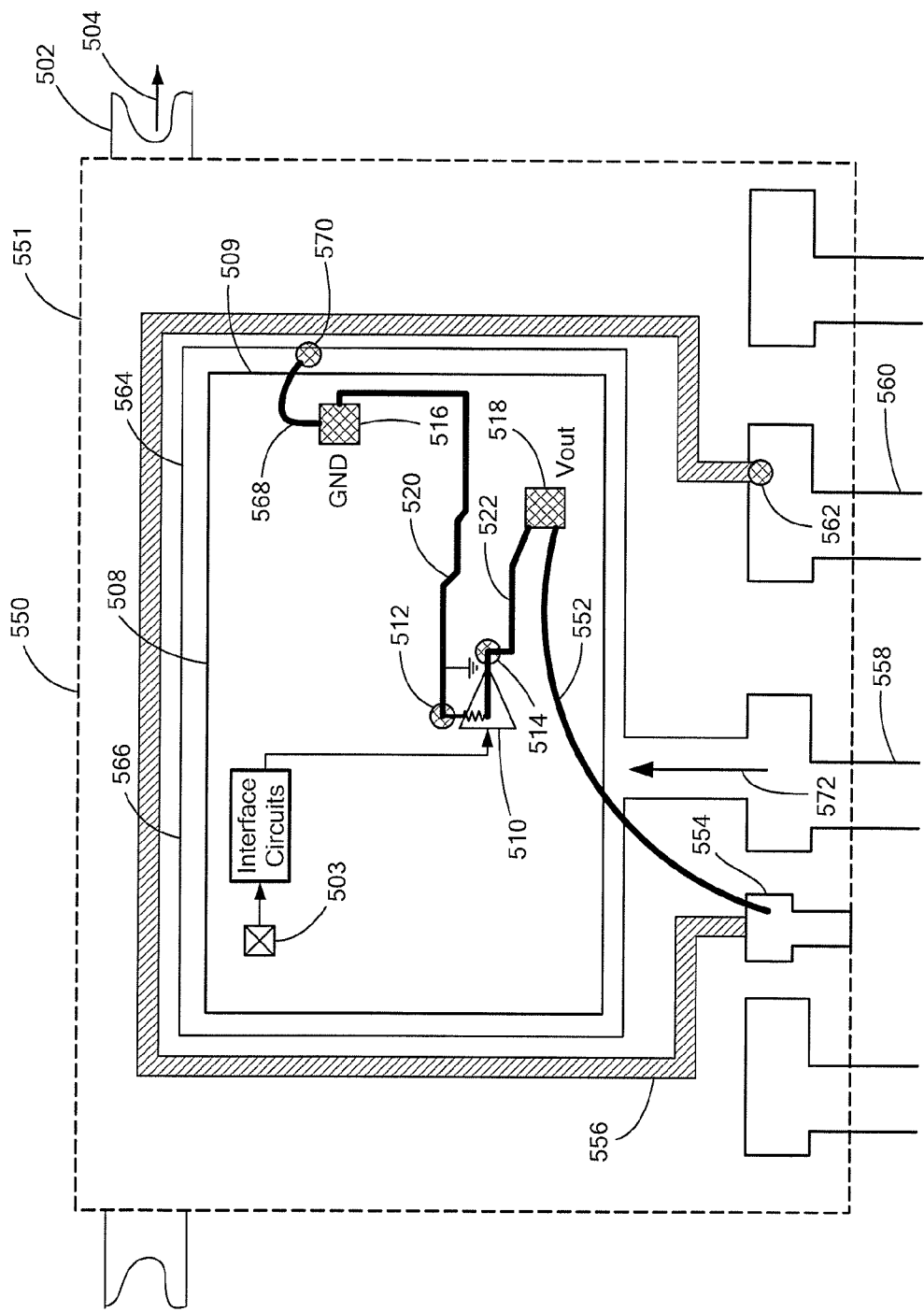
FIG. 9A is a block diagram showing a circuit die, for example, the circuit die of FIG. 5, coupled to another lead frame in an integrated circuit package, wherein the lead frame includes a compensation loop on a signal side of an output amplifier.

Referring now to FIG. 9A, in which like elements of FIG. 9 are shown having like reference designations, a magnetic field sensor 550 includes a lead frame 566 having a base plate 564, a ground pin 558 coupled to the base plate 564, and a signal output pin 560. The magnetic field sensor 550 also includes the circuit die 508 of FIG. 9 disposed upon the base plate 540. The circuit die 508 includes the substrate 509. The circuit die 508 also includes the magnetic field sensing element 503 disposed upon the substrate 509 and configured to generate the magnetic field signal responsive to the magnetic field (e.g., the magnetic field generated by the current 504 flowing in the conductor 502). The circuit die 508 also includes the output circuit 510 disposed upon the substrate 508. The output circuit 510 includes the circuit ground node 512 and the circuit output node 514. The output circuit 510 is configured to generate the output signal at the circuit output node 514 responsive to the magnetic field signal. The circuit die 508 also includes the ground circuit trace 520 having first and second ends. The first end of the ground circuit trace 520 is coupled to the circuit ground node 512. The circuit die 508 also includes the ground bonding pad 516 coupled to the second end of the ground circuit trace 520. The circuit die 508 also includes the output signal circuit trace 522 having first and second ends. The first end of the output signal circuit trace 522 is coupled to the circuit output node 514. The circuit die 508 also includes the output signal bonding pad 518 coupled to the second end of the output signal circuit trace 522. The magnetic field sensor 550 further includes the circuit loop 234 (FIG. 5). The circuit loop 234 includes a conductive path between the ground pin 558 and the signal output pin 560. The circuit loop 234 has a circuit loop interior area. The magnetic field sensor 550 further includes a compensated signal output node 562 coupled to the circuit output node 514. The magnetic field sensor 550 further includes a conductive structure, which includes a compensation loop 556 coupled in a series arrangement with the circuit loop 234. The compensation loop 556 has a compensation loop interior area. The compensation loop interior area is selected to be related to the interior area of the circuit loop 234. Also, a path (see, e.g., arrow 572) traversing the circuit loop 234 in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node 562 resulting from the circuit loop 234 experiencing a rapid change in flux of the magnetic field.

In the embodiment of FIG. 9A, the compensation loop 556 is coupled between the circuit output node 514 and the compensated signal output node 562, i.e., on the signal side of the circuit loop 234 (FIG. 5).

The compensation loop 556 is formed from a portion of the lead frame 566, and in particular, a loop 556 between the signal output pin 560 and a blind pin 554. A bond wire 552 couples the signal output bonding pad 518 to the blind pin 554, and a bond wire 568 couples the ground bonding pad 516 to the base plate 564.

Unlike the magnetic field sensor 500 of FIG. 9, the magnetic field sensor 550 has the ground pin 558 in the center of the pins, resulting in the compensation loop 556 avoiding the base plate 564 and avoiding the overhang of the substrate 509 as in FIG. 9.

Figure 9B:
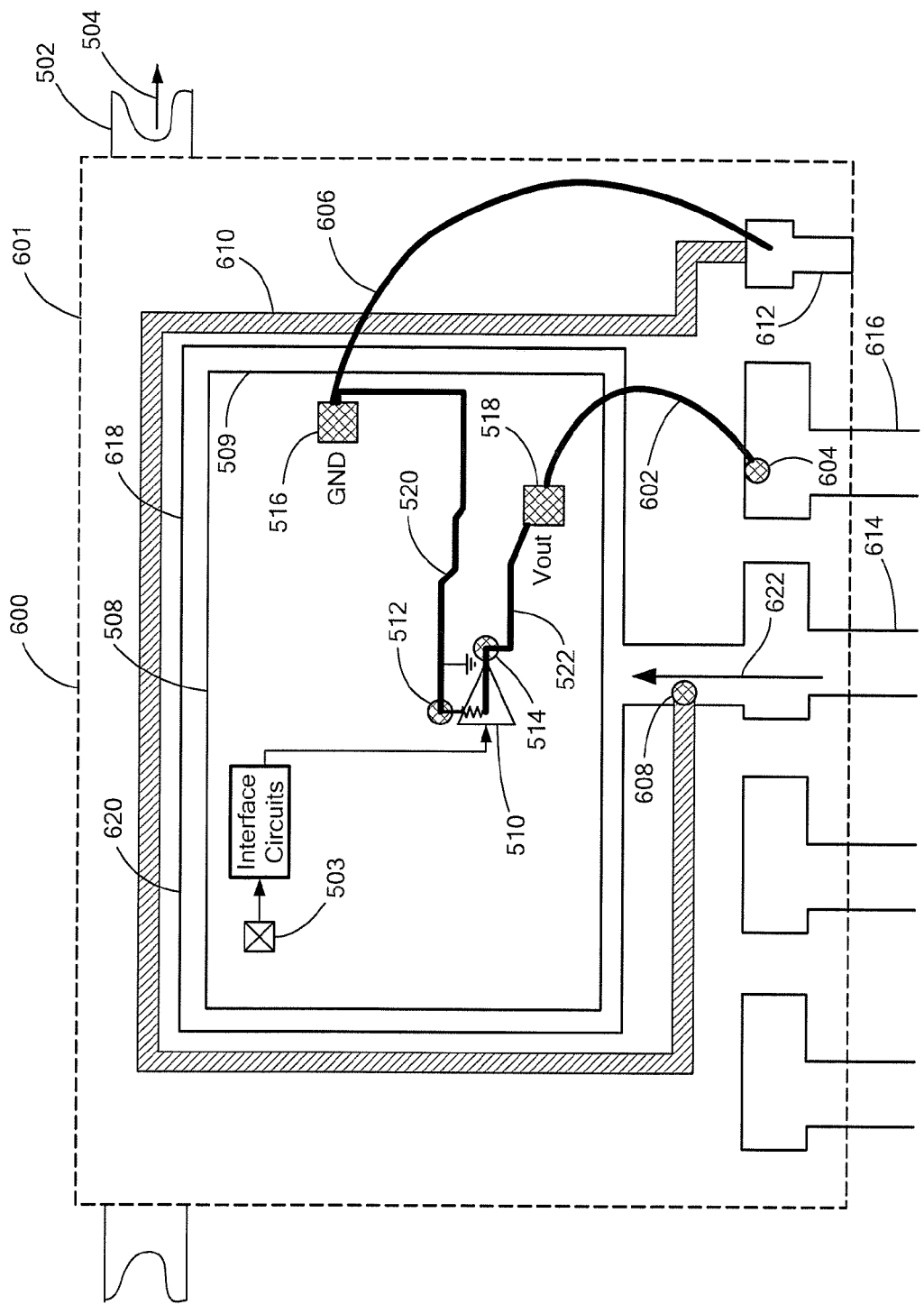
FIG. 9B is a block diagram showing a circuit die, for example, the circuit die of FIG. 5, coupled to yet another lead frame in an integrated circuit package, wherein the lead frame includes a compensation loop on a ground side of an output amplifier.

Referring now to FIG. 9B, in which like elements of FIGS. 9 and 9A are shown having like reference designations, a magnetic field sensor 600 includes a lead frame 620 having a base plate 618, a ground pin 614 coupled to the base plate 618, and a signal output pin 616. The magnetic field sensor 600 also includes the circuit die 508 disposed upon the base plate 618. The circuit die 508 includes the substrate 509. The circuit die 508 also includes the magnetic field sensing element 503 disposed upon the substrate 509 and configured to generate the magnetic field signal responsive to the magnetic field (e.g., the magnetic field generated by the current 504 flowing in the conductor 502). The circuit die 508 also includes the output circuit 510 disposed upon the substrate 508. The output circuit 510 includes the circuit ground node 512 and the circuit output node 514. The output circuit 510 is configured to generate the output signal at the circuit output node 514 responsive to the magnetic field signal. The circuit die 508 also includes the ground circuit trace 520 having first and second ends. The first end of the ground circuit trace 520 is coupled to the circuit ground node 512. The circuit die 508 also includes the ground bonding pad 516 coupled to the second end of the ground circuit trace 520. The circuit die 508 also includes the output signal circuit trace 522 having first and second ends. The first end of the output signal circuit trace 522 is coupled to the circuit output node 514. The circuit die 508 also includes the output signal bonding pad 518 coupled to the second end of the output signal circuit trace 522. The magnetic field sensor 600 further includes the circuit loop 234 (FIG. 5). The circuit loop 234 includes a conductive path between the ground pin 614 and the signal output pin 616. The circuit loop 234 has a circuit loop interior area. The magnetic field sensor 600 further includes a compensated signal output node 604 coupled to the circuit output node 514. The magnetic field sensor 600 further includes a conductive structure, which includes a compensation loop 610 coupled in a series arrangement with the circuit loop 234. The compensation loop 610 has a compensation loop interior area. The compensation loop interior area is selected to be related to the interior area of the circuit loop 234. Also, a path (see, e.g., arrow 622) traversing the circuit loop 234 in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node 604 resulting from the circuit loop 234 experiencing a rapid change in flux of the magnetic field.

In the embodiment of FIG. 9B, the compensation loop 610 is coupled between a loop termination node 608 and the ground node 512, i.e., on the ground side of the circuit loop 234 (FIG. 5).

The compensation loop 610 is formed from a portion of the lead frame 620, and in particular, a loop 610 between the ground pin 614 and a blind pin 612. A bond wire 602 couples the signal output bonding pad 518 to the signal output pin 616 and a bond wire 606 coupled the ground bonding pad 516 to the blind pin 612.

Figure 10:
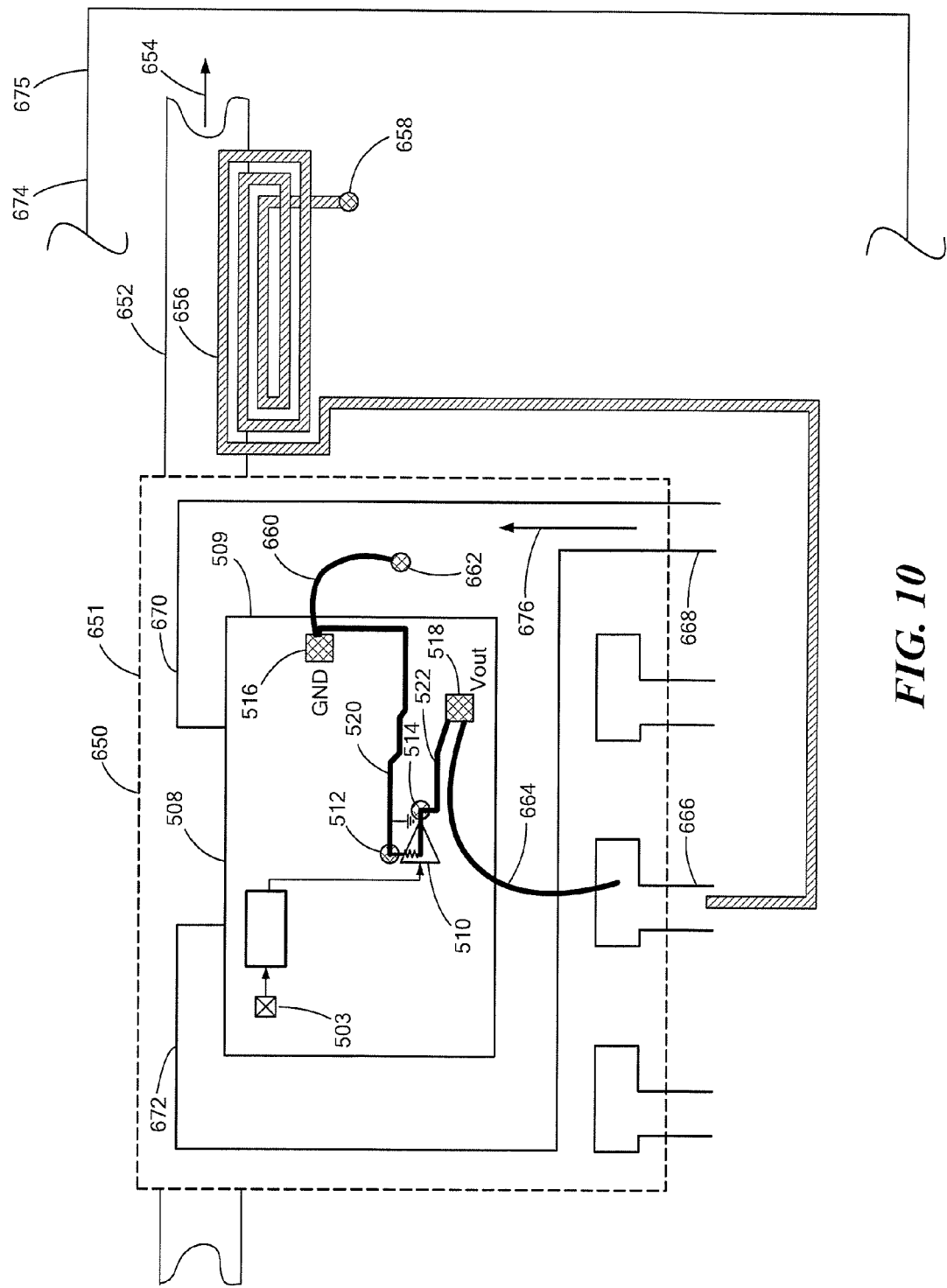
FIG. 10 is a block diagram showing a circuit die, for example, the circuit die of FIG. 5, coupled to yet another lead frame in an integrated circuit package, wherein the integrated circuit package is coupled to a circuit board, wherein the circuit board includes a compensation loop on the signal side of an output amplifier.

Referring now to FIG. 10, in which like elements of FIG. 9-9B are shown having like reference designations, a magnetic field sensor 674 includes an integrated magnetic field sensor 650 electrically coupled to a circuit board 675. The integrated magnetic field sensor 650 is like the magnetic field sensors 500, 550, 600 of FIGS. 9, 9A, 9B, respectively, but without any compensation loop. However, it will be understood that the integrated magnetic field sensor 650 includes the circuit loop 234 of FIG. 5.

The magnetic field sensor 674 (i.e., the integrated magnetic field sensor 650) includes a lead frame 672 having a base plate 670, a ground pin 668 coupled to the base plate 670, and a signal output pin 666. The magnetic field sensor 674 also includes the circuit die 508 of FIGS. 9-9B disposed upon the base plate 670. The circuit die 508 includes the substrate 509. The circuit die 508 also includes the magnetic field sensing element 503 disposed upon the substrate 509 and configured to generate the magnetic field signal responsive to the magnetic field (e.g., a magnetic field generated by a current 654 flowing in a conductor 652). The circuit die 508 also includes the output circuit 510 disposed upon the substrate 508. The output circuit 510 includes the circuit ground node 512 and the circuit output node 514. The output circuit 510 is configured to generate the output signal at the circuit output node 514 responsive to the magnetic field signal. The circuit die 508 also includes the ground circuit trace 520 having first and second ends. The first end of the ground circuit trace 520 is coupled to the circuit ground node 512. The circuit die 508 also includes the ground bonding pad 516 coupled to the second end of the ground circuit trace 520. The circuit die 508 also includes the output signal circuit trace 522 having first and second ends. The first end of the output signal circuit trace 522 is coupled to the circuit output node 514. The circuit die 508 also includes the output signal bonding pad 518 coupled to the second end of the output signal circuit trace 522. The magnetic field sensor 674 further includes the circuit loop 234 (FIG. 5). The circuit loop 234 includes a conductive path between the ground pin 668 and the signal output pin 666. The circuit loop 234 has a circuit loop interior area. The magnetic field sensor 674 further includes a compensated signal output node 658 coupled to the circuit output node 514. The magnetic field sensor 674 further includes a conductive structure, which includes a compensation loop 656 coupled in a series arrangement with the circuit loop 234. The compensation loop 656 has a compensation loop interior area. The compensation loop interior area is selected to be related to the interior area of the circuit loop 234. Also, a path (see, e.g., arrow 676) traversing the circuit loop 234 in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node 658 resulting from the circuit loop 234 experiencing a rapid change in flux of the magnetic field.

In the embodiment of FIG. 10, the compensation loop 656 is coupled between the circuit output node 514 and the compensated signal output node 658, i.e., on the signal side of the circuit loop 234 (FIG. 5).

The compensation loop 656 is formed by a conductive trace upon the circuit board 675, in one or more conductive layers of the circuit board 675. A bond wire 664 couples the signal output bonding pad 518 to the signal output pin 666 and a bond wire 660 couples the ground bonding pad 516 to the base plate 670.

The circuit board 675 can also include the conductor 652 as a current-carrying conductive trace configured to carry the current 654, wherein the magnetic field is generated in response to the current. The compensation loop 656 is disposed proximate to the conductor 652. The compensation loop 656 can be disposed at an edge of the conductor 652 so that the magnetic field passes perpendicularly through the compensation loop 656.

The compensation loop 656 is shown here to include a plurality of nested loops. Particularly when the compensation loop 656 is not under the influence of a flux concentrator, which is shown in FIGS. 1 and 2-2A, the compensation loop 656 will experience a smaller magnetic field than may be experienced by the circuit loop 234 (FIG. 5). Thus, in order to compensate and reduce or cancel the transient signal of FIG. 6A, it may be desirable to provide the compensation loop 656 with multiple loops as shown or with a larger area than the circuit loop 234 of FIG. 5.

Figure 10A:
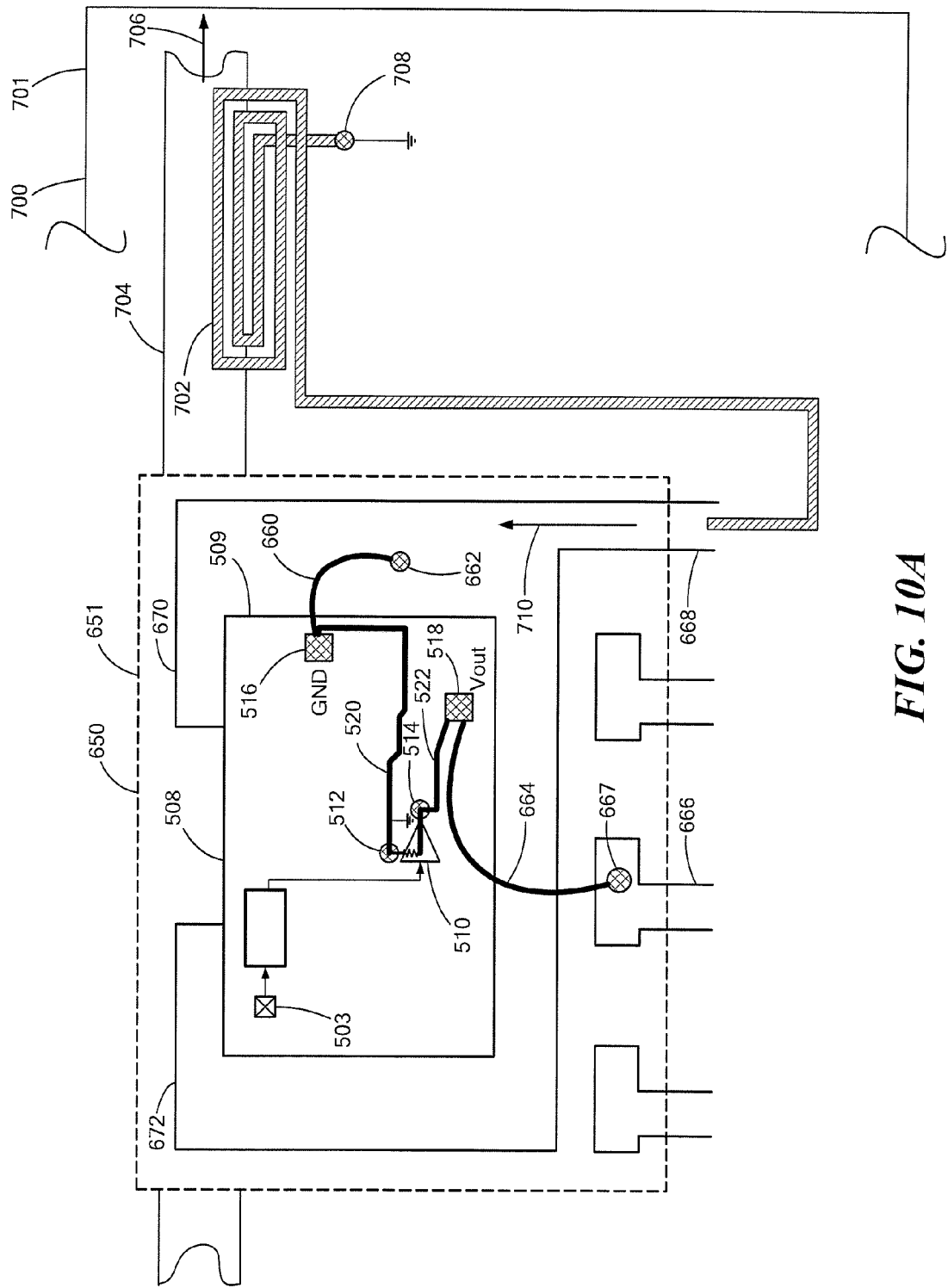
FIG. 10A is a block diagram showing a circuit die, for example, the circuit die of FIG. 5, coupled to yet another lead frame in an integrated circuit package, wherein the integrated circuit package is coupled to a circuit board, wherein the circuit board includes a compensation loop on the ground side of an output amplifier.

Referring now to FIG. 10A, in which like elements of FIGS. 9-9B and 10 are shown having like reference designations, a magnetic field sensor 700 includes the integrated magnetic field sensor 650 of FIG. 10, electrically coupled to a circuit board 701. The integrated magnetic field sensor 650 is like the magnetic field sensors 500, 550, 600 of FIGS. 9, 9A, 9B, respectively, but without any compensation loop. However, it will be understood that the integrated magnetic field sensor 650 includes the circuit loop 234 of FIG. 5.

The magnetic field sensor 700 (i.e., the integrated magnetic field sensor 650) includes the lead frame 672 having the base plate 670, the ground pin 668 coupled to the base plate 670, and a signal output pin 666. The magnetic field sensor 700 also includes the circuit die 508 of FIGS. 9-9B disposed upon the base plate 670. The circuit die 508 includes the substrate 509. The circuit die 508 also includes the magnetic field sensing element 503 disposed upon the substrate 509 and configured to generate the magnetic field signal responsive to the magnetic field (e.g., a magnetic field generated by a current 706 flowing in a conductor 704). The circuit die 508 also includes the output circuit 510 disposed upon the substrate 508. The output circuit 510 includes the circuit ground node 512 and the circuit output node 514. The output circuit 510 is configured to generate the output signal at the circuit output node 514 responsive to the magnetic field signal. The circuit die 508 also includes the ground circuit trace 520 having first and second ends. The first end of the ground circuit trace 520 is coupled to the circuit ground node 512. The circuit die 508 also includes the ground bonding pad 516 coupled to the second end of the ground circuit trace 520. The circuit die 508 also includes the output signal circuit trace 522 having first and second ends. The first end of the output signal circuit trace 522 is coupled to the circuit output node 514. The circuit die 508 also includes the output signal bonding pad 518 coupled to the second end of the output signal circuit trace 522. The magnetic field sensor 700 further includes the circuit loop 234 (FIG. 5). The circuit loop 234 includes a conductive path between the ground pin 668 and the signal output pin 666. The circuit loop 234 has a circuit loop interior area. The magnetic field sensor 700 further includes a compensated signal output node 667 coupled to the circuit output node 514. The magnetic field sensor 700 further includes a conductive structure, which includes a compensation loop 702 coupled in a series arrangement with the circuit loop 234. The compensation loop 702 has a compensation loop interior area. The compensation loop interior area is selected to be related to the interior area of the circuit loop 234. Also, a path (see, e.g., arrow 710) traversing the circuit loop 234 in a direction from a first end of the series arrangement to a second end of the series arrangement has a circuit loop rotation direction opposite from a compensation loop rotation direction traversing the compensation loop along the same path. The compensation loop interior area and the compensation loop rotation direction are selected to result in a reduction of an overshoot or an undershoot of an output signal at the compensated signal output node 667 resulting from the circuit loop 234 experiencing a rapid change in flux of the magnetic field.

In the embodiment of FIG. 10A, the compensation loop 702 is coupled between a loop termination node 708 and the ground node 512, i.e., on the ground side of the circuit loop 234. The loop termination node can be coupled to a reference voltage, for example, ground.

The compensation loop 702 is formed by a conductive trace upon the circuit board 701, in one or more conductive layers of the circuit board 701. The bond wire 664 couples the signal output bonding pad 518 to the signal output pin 666 and the bond wire 660 couples the ground bonding pad 516 to the base plate 670.

The circuit board 674 can also include the conductor 704 as a current-carrying conductive trace configured to carry the current 706, wherein the magnetic field is generated in response to the current 706. The compensation loop 702 is disposed proximate to the conductor 704.

The compensation loop 702 is shown here to include a plurality of nested loops. Particularly when the compensation loop 702 is not under the influence of a flux concentrator, which is shown in FIGS. 1 and 2-2A, the compensation loop 702 will experience a smaller magnetic field than may be experienced by the circuit loop 234 (FIG. 5). Thus, in order to compensate and reduce or cancel the transient signal of FIG. 6A, it may be desirable to provide the compensation loop 702 with multiple loops as shown or with a larger area than the circuit loop 234 of FIG. 5.

Figure 11:
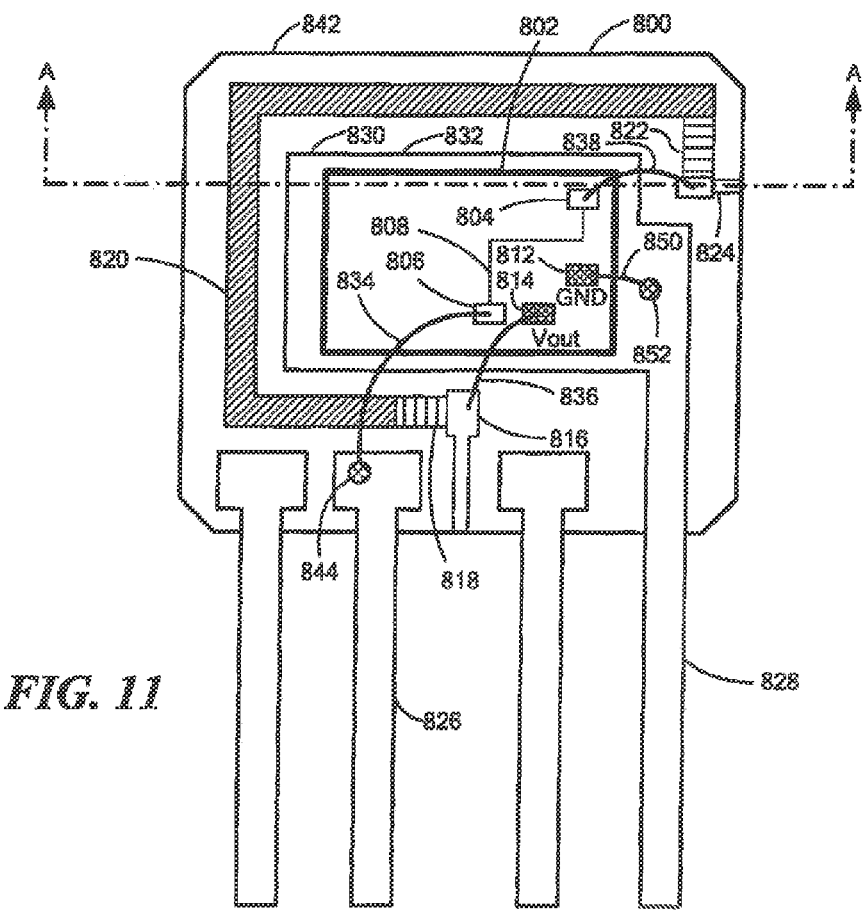
FIGS. 11 and 11A are block diagrams showing two views of a circuit die coupled to yet another lead frame in an integrated circuit package, wherein the lead frame includes a compensation loop on a signal side of an output amplifier, and wherein the compensation loop has bends to transition to a plane below a base plate of the lead frame.
Figure 11A:
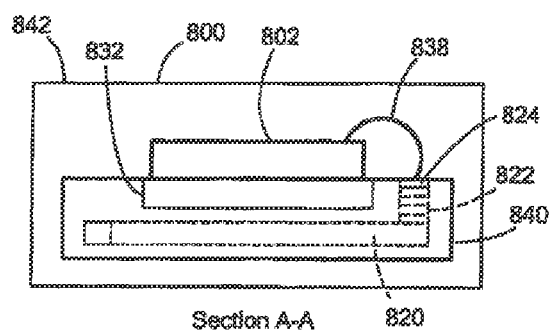

Comparing FIGS. 9 and 9A above, it will be apparent that is may be difficult to provide a compensation loop formed as a part of a lead frame that does not interfere with the base plate of the lead frame. FIGS. 11 and 11A show another way for the compensation loop to avoid the base plate.

Referring now to FIG. 11, a magnetic field sensor 800 includes a lead frame 830 having a base plate 832, a ground pin 828, and a signal output pin 826. The lead frame 830 also includes a compensation loop 820 coupled at one end to a blind pin 816 and at the other end to another blind pin 824. Transition regions 818, 822 (or bends) can depress the compensation loop to be at a level below the base plate 832. Though not shown as such, the depression could be used to pass the compensation loop 820 under the base plate 832.

A ground bonding pad 812 is coupled to the base plate 832 with a bond wire 850. A signal output bonding pad 814 is coupled to the blind pin 816 with a bond wire 834.

The blind pin 824 is coupled to a bonding pad 804 upon circuit die 802 with a wire bond 838. The bonding pad 804 is coupled with a circuit trace 808 to an opposite side of the circuit die 802, to a bonding pad 806. A bond wire 834 couples the bonding pad 806 to the signal output pin 826 and to a compensation node 844.

The compensation loop 820 is shown to be coupled on an output signal side of a circuit loop 234 (FIG. 5). However, it will be understood that a similar compensation loop can be coupled on a ground side of the circuit loop 234.

Referring now to FIG. 11A, in which like elements of FIG. 11 are shown having like reference designations, the compensation loop 830 is shown to be in a different plane than the base plate 832 by way of the transition regions 818, 822. A first molded body 840 can be first formed to support the compensation loop and the base plate. A second molded body 842 can be formed in a second molding step to surround the first molded body 840, and the substrate 802.

Figure 12:
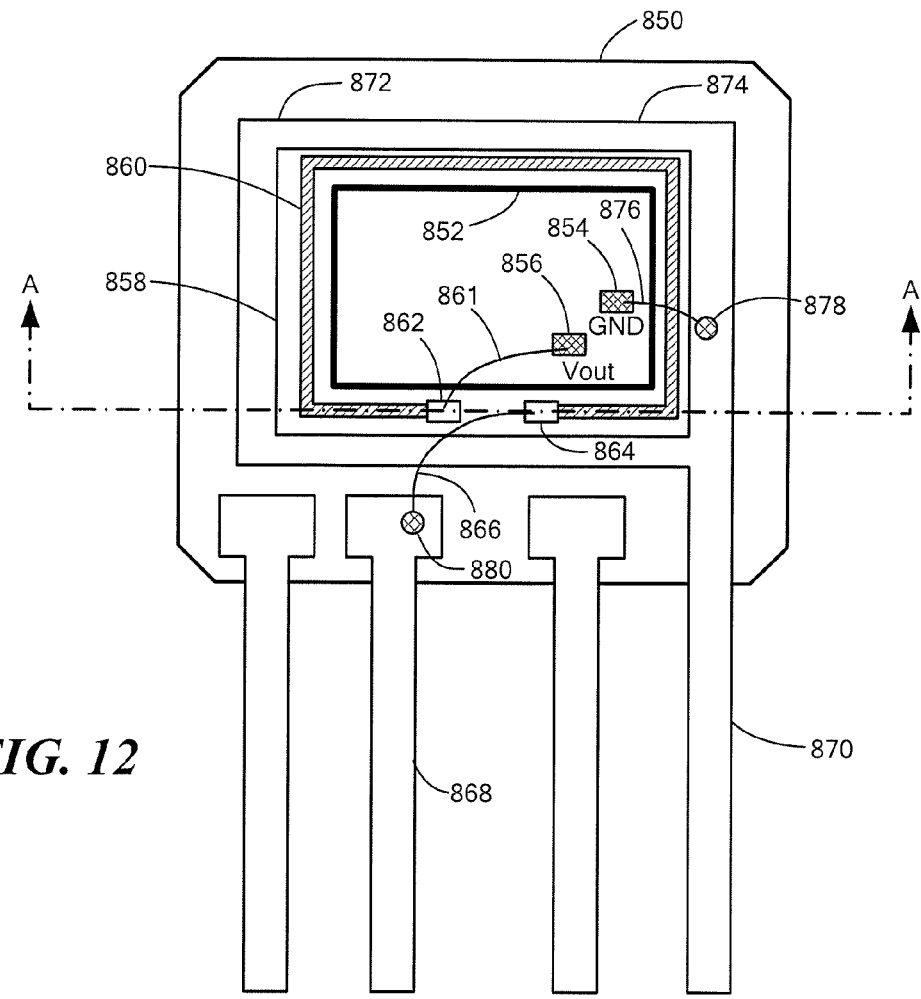
FIGS. 12 and 12A are block diagrams showing two views of a circuit die coupled to yet another lead frame in an integrated circuit package, wherein the integrated circuit includes a circuit board having a compensation loop on a signal side of an output amplifier.

Referring now to FIG. 12, another magnetic field sensor 850 can include a lead frame 872 having a base plate 874, a signal output pin 868, and a ground pin 870 coupled to the base plate 874. A small circuit board 858 can be disposed upon the base plate 874. The circuit board 858 can include a compensation loop 860 formed as a conductive trace upon the circuit board 858. A circuit die 852 can be disposed upon the circuit board 858. The circuit die 852 can include a ground bonding pad 854 and a signal output bonding pad 856. The signal output bonding pad 856 can be coupled to one end of the compensation loop 860 with a bond wire 861. The other end of the compensation loop 860 can be coupled to the signal output pin 868 at a compensated signal output node 880 with a bond wire 866. A bond wire 876 can couple the ground bonding pad 854 to the base plate 874.

The compensation loop 860 is shown to be coupled on an output signal side of a circuit loop 234 (FIG. 5). However, it will be understood that a similar compensation loop can be coupled on a ground side of the circuit loop 234.

Figure 12A:
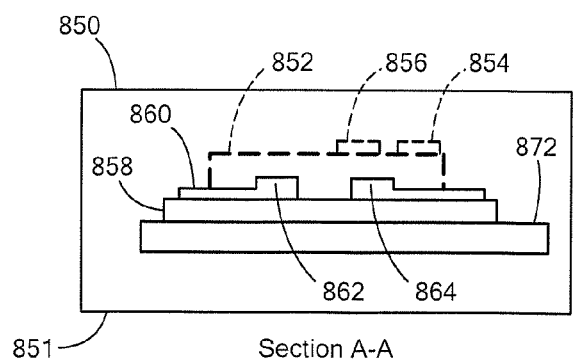

Referring now to FIG. 12A, in which like elements of FIG. 12 are shown having like reference designations, the magnetic field sensor 850 can include one molded body 851.

Figure 13:
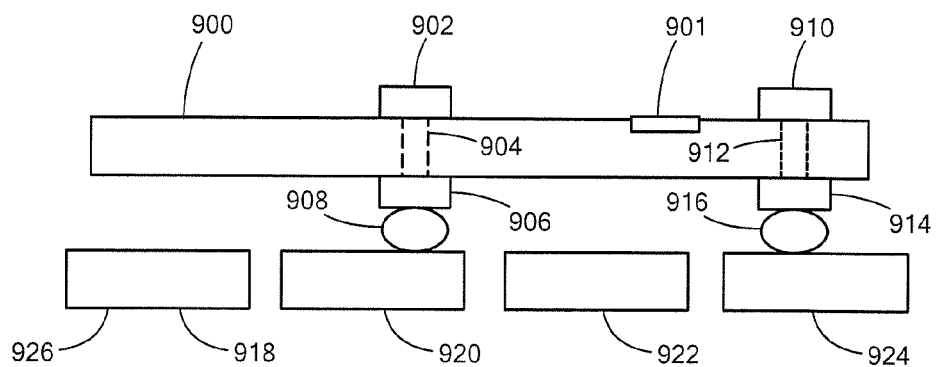

Referring now to FIG. 13, whereas various circuit couplings to a signal output pin and to a ground pin are shown in prior figures to be comprised of wire bonds, in other embodiments, one or more of the circuit couplings to a signal output pin 920 and to a ground pin 924 of a lead frame 926 of any of the above-described magnetic field sensors can instead be direct couplings comprised of solder balls 908, 916, coupled through soldering features 906, 914, respectively, and through vias 904, 912, respectively, to bonding pads 902, 910, respectively, upon a substrate 900.

In the arrangement shown, the active side of the substrate 900 is disposed upward such that an output amplifier 901 is disposed on a side of the substrate 900 that is facing away from the lead frame 926.

While solder balls 908, 916 are shown, the direct bonding can be a selected one of a solder ball, a copper pillar, a gold bump, a eutectic and high lead solder bump, a no-lead solder bump, a gold stud bump, a polymeric conductive bump, an anisotropic conductive paste, or a conductive film coupled between the features 906, 914 and the lead frame pins.

Figure 13A:
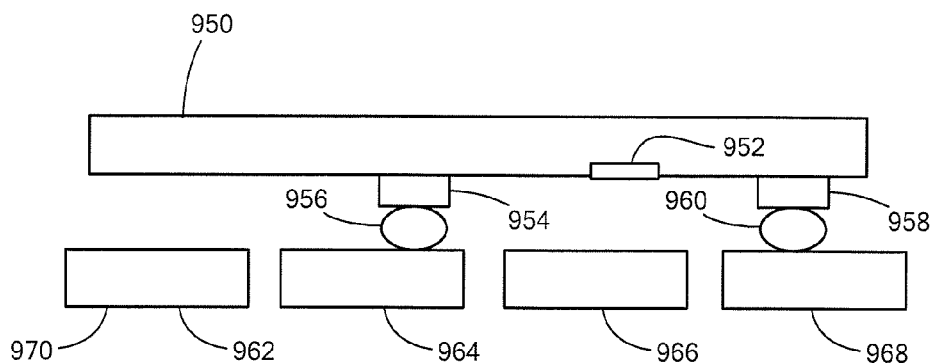

Referring now to FIG. 13A, direct couplings can instead be made between a substrate 950 and a lead frame 970 (e.g., to pins 964, 968) relatively disposed in a so-called "flip-chip" arrangement, such that an active surface of the substrate 950 is disposed downward such that an output amplifier 952 is disposed on a side of the substrate 950 that is facing toward the lead frame 970. The direct couplings can be comprised of solder balls 956, 960, coupled between bonding pads 954, 958, respectively, and the lead frame pins 964, 968.

While solder balls 956, 960 are shown, the direct bonding can be a selected one of a solder ball, a copper pillar, a gold bump, a eutectic and high lead solder bump, a no-lead solder bump, a gold stud bump, a polymeric conductive bump, an anisotropic conductive paste, or a conductive film coupled between the bonding pads 954, 958 and the lead frame pins.

While compensation loops are shown in embodiments above to be generally disposed on a signal side or on a ground side of the circuit loop 234 of FIG. 5, in other embodiments, the compensation loop can be placed in series arrangements at other intermediate regions of the circuit loop 234 (see, e.g., FIG. 4C).

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
a lead frame comprising: a base plate, a ground pin coupled to the base plate, and a signal output pin;
a circuit die disposed upon the base plate, the circuit die comprising:
a substrate;
a magnetic field sensing element disposed upon the substrate and configured to generate a magnetic field signal responsive to a magnetic field;
an output circuit disposed upon the substrate, the output circuit comprising a circuit ground node and a circuit output node, wherein the output circuit is configured to generate an output signal at the circuit output node responsive to the magnetic field signal;
a ground circuit trace having first and second ends, wherein the first end of the ground circuit trace is coupled to the circuit ground node;
a ground bonding pad coupled to the second end of the ground circuit trace;
an output signal circuit trace having first and second ends, wherein the first end of the output signal circuit trace is coupled to the circuit output node; and
an output signal bonding pad coupled to the second end of the output signal circuit trace, wherein the magnetic field sensor further comprises:
a circuit loop comprising a conductive path between the ground pin and the signal output pin, wherein the circuit loop has a circuit loop interior area;
a compensated signal output node coupled to the circuit output node; and
a conductive structure, comprising:
a compensation loop coupled in a series arrangement with the circuit loop, wherein the compensation loop has a compensation loop interior area, wherein the compensation loop interior area is selected to be related to the interior area of the circuit loop, wherein a path traversing the circuit loop in a direction from a first end of the series arrangement to a second end of the series arrangement has a circuit loop rotation direction opposite from a compensation loop rotation direction traversing the compensation loop along the same path, and wherein the compensation loop interior area and the compensation loop rotation direction are selected to result in a reduction of an overshoot or an undershoot of an output signal at the compensated signal output node resulting from the circuit loop experiencing a rapid change in flux of the magnetic field.

2. The magnetic field sensor of claim 1, wherein the compensation loop is coupled between the circuit output node and the compensated signal output node or the compensation loop is coupled between the between a loop termination node and the ground node.

3. The magnetic field sensor of claim 1, wherein the compensation loop interior area is selected to be approximately the same as the interior area of the circuit loop.

4. The magnetic field sensor of claim 1, wherein the compensation loop comprises a conductive trace formed in one or more metal layers of the circuit die, and wherein the compensated signal output node corresponds to the signal output pin.

5. The magnetic field sensor of claim 4, wherein the conductive structure further comprises a wire bond coupled between the output signal bonding pad and the signal output pin.

6. The magnetic field sensor of claim 4, wherein the conductive structure further comprises a selected one of a solder ball, a copper pillar, a gold bump, a eutectic and high lead solder bump, a no-lead solder bump, a gold stud bump, a polymeric conductive bump, an anisotropic conductive paste, or a conductive film coupled between the output signal bonding pad and the signal output pin.

7. The magnetic field sensor of claim 1, wherein the compensation loop is comprised of a portion of the lead frame, and wherein the compensated signal output node corresponds to the signal output pin.

8. The magnetic field sensor of claim 7, wherein the conductive structure further comprises a wire bond coupled between the output signal bonding pad and the lead frame.

9. The magnetic field sensor of claim 7, wherein the conductive structure further comprises a selected one of a solder ball, a gold bump, a eutectic and high lead solder bump, a no-lead solder bump, a gold stud bump, a polymeric conductive bump, an anisotropic conductive paste, or a conductive film coupled between the output signal bonding pad and the lead frame.

10. The magnetic field sensor of claim 1, further comprising a circuit board, wherein the compensation loop comprises a conductive trace formed on the circuit board.

11. The magnetic field sensor of claim 10, wherein the circuit board is disposed such that a major surface of the circuit board is proximate to a major surface of the circuit die.

12. The magnetic field sensor of claim 10, wherein the circuit board comprises a current-carrying conductive trace configured to carry a current, wherein the magnetic field is generated in response to the current.

13. The magnetic field sensor of claim 1, wherein the circuit loop comprises:
 a first conductive path between the ground pin and the circuit ground node;
 a second conductive path between the circuit ground node and the circuit output node; and
 a third conductive path between the circuit output node and the signal output pin.

14. The magnetic field sensor of claim 1, further comprising a flux concentrator disposed proximate to the circuit die.

15. The magnetic field sensor of claim 14, wherein the flux concentrator comprises a donut shape having a notch in which the circuit die is disposed.

16. The magnetic field sensor of claim 15, wherein the donut shape has in internal diameter selected to accept a current-carrying conductor configured to carry a current, wherein the magnetic field is generated in response to the current.

17. The magnetic field sensor of claim 1, further comprising a current-carrying conductor configured to carry a current, wherein the magnetic field is generated in response to the current.

18. The magnetic field sensor of claim 17, further comprising a flux concentrator disposed proximate to the circuit die and proximate to the current-carrying conductor.

19. The magnetic field sensor of claim 17, further comprising a U-shaped flux concentrator comprising two legs and an end region joining the two legs, wherein the circuit die and the current-carrying conductor are disposed between the two legs of the U-shaped flux concentrator.

20. The magnetic field sensor of claim 19, further comprising a molded package surrounding the circuit die, wherein the current-carrying conductor comprises first and second major surface and first and second opposing joining surfaces at edges between the first and second major surfaces, wherein the current-carrying conductor comprises a first notch in the first joining surface and a second notch in the second joining surface, wherein the molded package is disposed in a close fit arrangement within the first notch providing relative alignment of the circuit die to the current-carrying conductor, and wherein the end region of the U-shaped flux concentrator is disposed within the second notch in a close fit arrangement providing relative alignment of the U-shaped flux concentrator to the current-carrying conductor and to the circuit die.

21. A method of compensating an output signal in a magnetic field sensor responsive to a magnetic field, the magnetic field sensor comprising a lead frame having a ground pin and a signal output pin, the magnetic field sensor also comprising a circuit die disposed upon the lead frame and comprising a magnetic field sensing element and an output circuit coupled to the magnetic field sensing element, wherein the output circuit comprises a circuit ground node and a circuit output node, the method comprising:
 identifying a circuit loop in the magnetic field sensor comprised of a conductive path between the ground pin and the signal output pin, wherein the circuit loop comprises a circuit loop interior area;
 providing a compensated signal output node coupled to the circuit output node; and
 providing a conductive structure, comprising:
  providing a compensation loop coupled in a series arrangement with the circuit loop, wherein the compensation loop has a compensation loop interior area, wherein the compensation loop interior area is selected to be related to the interior area of the circuit loop, wherein a path traversing the circuit loop in a direction from a first end of the series arrangement to a second end of the series arrangement has a circuit loop rotation direction opposite from a compensation loop rotation direction traversing the compensation loop along the same path, and wherein the compensation loop interior area and the compensation loop rotation direction are selected to result in a reduction of an overshoot or an undershoot of an output signal at the compensated signal output node resulting from the circuit loop experiencing a rapid change in flux of the magnetic field.

22. The method of claim 21, wherein the providing the compensation loop comprises providing the compensation loop coupled between the circuit output node and the compensated signal output node or providing the compensation loop coupled between the between a loop termination node and the ground node.

23. The method of claim 21, wherein the compensation loop interior area is selected to be approximately the same as the interior area of the circuit loop.

24. The method of claim 21, wherein the compensation loop comprises a conductive trace formed in one or more metal layers of the circuit die, and wherein the compensated signal output node corresponds to the signal output pin.

25. The method of claim 21, wherein the compensation loop is comprised of a portion of the lead frame, and wherein the compensated signal output node corresponds to the signal output pin.

26. The method of claim 21, wherein the compensation loop comprises a conductive trace formed on a circuit board.

27. The method of claim 26, wherein the circuit board is disposed such that a major surface of the circuit board is proximate to a major surface of the circuit die.

28. The method of claim 26, wherein the circuit board comprises a current-carrying conductive trace configured to carry a current, wherein the magnetic field is generated in response to the current.

29. The method of claim 21, wherein the circuit loop comprises:
  a first conductive path between the ground pin and the circuit ground node;
  a second conductive path between the circuit ground node and the circuit output node; and
  a third conductive path between the circuit output node and the signal output pin.

30. The method of claim 21, further comprising placing a flux concentrator proximate to the circuit die.

31. The method of claim 30, wherein the flux concentrator comprises a donut shape having a notch in which the circuit die is disposed.

32. The method of claim 21, wherein the donut shape has in internal diameter selected to accept a current-carrying conductor configured to carry a current, wherein the magnetic field is generated in response to the current.

33. The method of claim 21, further comprising placing a current-carrying conductor configured to carry a current proximate to the circuit die, wherein the magnetic field is generated in response to the current.

34. The method of claim 33, further comprising placing a flux concentrator proximate to the circuit die and proximate to the current-carrying conductor.

35. The method claim 33, further comprising placing a U-shaped flux concentrator proximate to the circuit die, the U-Shaped flux concentrator comprising two legs and an end region joining the two legs, wherein the circuit die and the current-carrying conductor are disposed between the two legs of the U-shaped flux concentrator.

36. The method of claim 35, further comprising molding a molded package surrounding the circuit die, wherein the current-carrying conductor comprises first and second major surface and first and second opposing joining surfaces at edges between the first and second major surfaces, wherein the current-carrying conductor comprises a first notch in the first joining surface and a second notch in the second joining surface, wherein the molded package is disposed in a close fit arrangement within the first notch providing relative alignment of the circuit die to the current-carrying conductor, and wherein the end region of the U-shaped flux concentrator is disposed within the second notch in a close fit arrangement providing relative alignment of the U-shaped flux concentrator to the current-carrying conductor and to the circuit die.

* * * * *

UNITED STATES PATENT AND TRADEMARK OFFICE
CERTIFICATE OF CORRECTION

PATENT NO. : 8,339,134 B2
APPLICATION NO. : 12/900969
DATED : December 25, 2012
INVENTOR(S) : Weihua Chen et al.

It is certified that error appears in the above-identified patent and that said Letters Patent is hereby corrected as shown below:

In the Specification

Column 2, lines 56-57 delete "between the between a" and replace with --between a--.

Column 3, line 23-24 delete "between the between a" and replace with --between a--.

Column 3, line 37 delete "FIG." and replace with --FIGS.--.

Column 3, line 39 delete "FIG." and replace with --FIGS.--.

Column 3, line 41 delete "FIG." and replace with --FIGS.--.

Column 3, line 62 delete "FIG. 7 is block diagram" and replace with --FIG. 7 is a block diagram--.

Column 3, line 64 delete "FIG. 7A is block diagram" and replace with --FIG. 7A is a block diagram--.

Column 7, line 18 delete "including, but not limited to ferrite" and replace with --including, but not limited to, ferrite--.

Column 11, line 55 delete "magnetic field sensor are shown" and replace with --magnetic field sensors are shown--.

Column 12, line 61 delete "about 3 mm×about 1.5 mm." and replace with --about 3 mm × about 1.5 mm.--.

Column 22, line 36 delete "is may be" and replace with --it may be--.

Signed and Sealed this
Twentieth Day of October, 2015

Michelle K. Lee
*Director of the United States Patent and Trademark Office*

CERTIFICATE OF CORRECTION (continued)
U.S. Pat. No. 8,339,134 B2

In the Claims

Column 25, line 2 delete "between the between a" and replace with --between a--.